(12) United States Patent
Ueno

(10) Patent No.: US 7,318,718 B2
(45) Date of Patent: Jan. 15, 2008

(54) STEREOLITHOGRAPHIC APPARATUS AND METHOD FOR MANUFACTURING THREE-DIMENSIONAL OBJECT

(75) Inventor: Takakuni Ueno, Kanagawa (JP)

(73) Assignee: Teijin Seiki Co., Ltd., Tokyo (JP)

( * ) Notice: Subject to any disclaimer, the term of this patent is extended or adjusted under 35 U.S.C. 154(b) by 292 days.

(21) Appl. No.: 09/874,675

(22) Filed: Jun. 4, 2001

(65) Prior Publication Data

US 2001/0048184 A1   Dec. 6, 2001

(30) Foreign Application Priority Data

Jun. 6, 2000   (JP)   ............ P2000-169471
Jun. 9, 2000   (JP)   ............ P2000-173965

(51) Int. Cl.
  *B29C 35/08*   (2006.01)
(52) U.S. Cl. ............ 425/174.4; 264/485; 264/492; 264/493
(58) Field of Classification Search ............ 425/174.4; 264/492, 493, 485
See application file for complete search history.

(56) References Cited

U.S. PATENT DOCUMENTS

| | | | | |
|---|---|---|---|---|
| 5,519,816 A | * | 5/1996 | Pomerantz et al. | ......... 395/119 |
| 5,558,884 A | * | 9/1996 | Hug et al. | ............. 425/174.4 |
| 5,595,703 A | * | 1/1997 | Swaelens et al. | ........... 264/401 |
| 6,034,349 A | * | 3/2000 | Ota | ....................... 219/121.73 |
| 6,051,179 A | * | 4/2000 | Hagenau | ....................... 264/401 |
| 6,251,550 B1 | * | 6/2001 | Ishikawa | ....................... 430/22 |
| 2002/0115021 A1 | * | 8/2002 | Piao | ............................ 430/311 |
| 2002/0149137 A1 | * | 10/2002 | Jang et al. | ................... 264/494 |

OTHER PUBLICATIONS

Webster's Ninth New Collegiate Dictionary, 1985, Merriam-Webster, Inc., p. 684.*

* cited by examiner

*Primary Examiner*—Yogendra N. Gupta
*Assistant Examiner*—Emmanuel S. Luk
(74) *Attorney, Agent, or Firm*—Darby & Darby

(57) ABSTRACT

An optical stereolithographic apparatus performs optical stereolithography by preparing a mask on a light-transmissible member (31) on the basis of data for one layer with respect to optical stereolithography, exposing an unhardened resin layer (96) of photohardenable resin to light through the mask, and repeating an exposure operation. The optical stereolithographic apparatus has an optical system in which the light-transmissible member (31) and the unhardened resin layer (96) are spaced from each other at a predetermined distance, and the unhardened resin layer (96) of the photohardenable resin is subjected to a projection exposure through the mask.

30 Claims, 21 Drawing Sheets

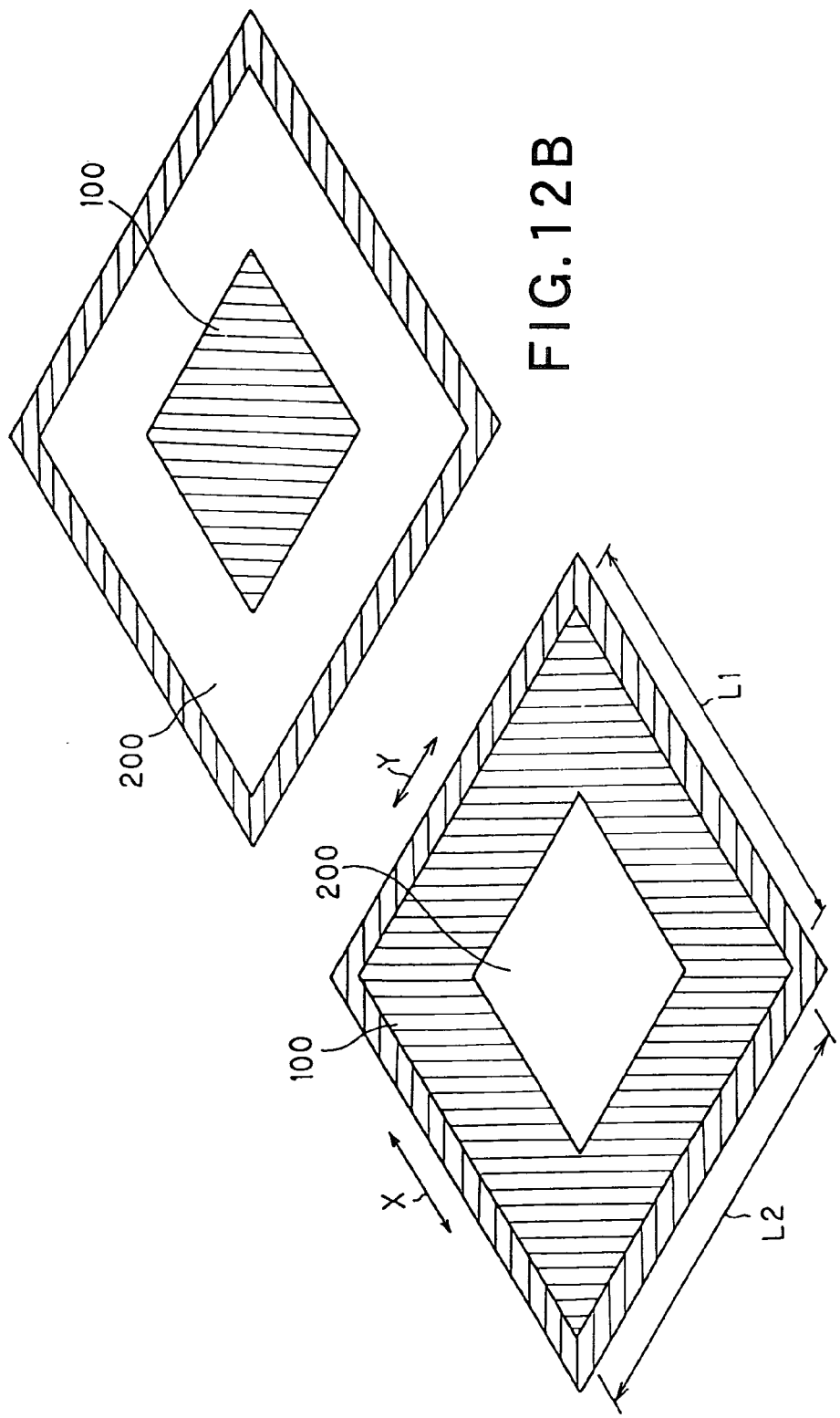

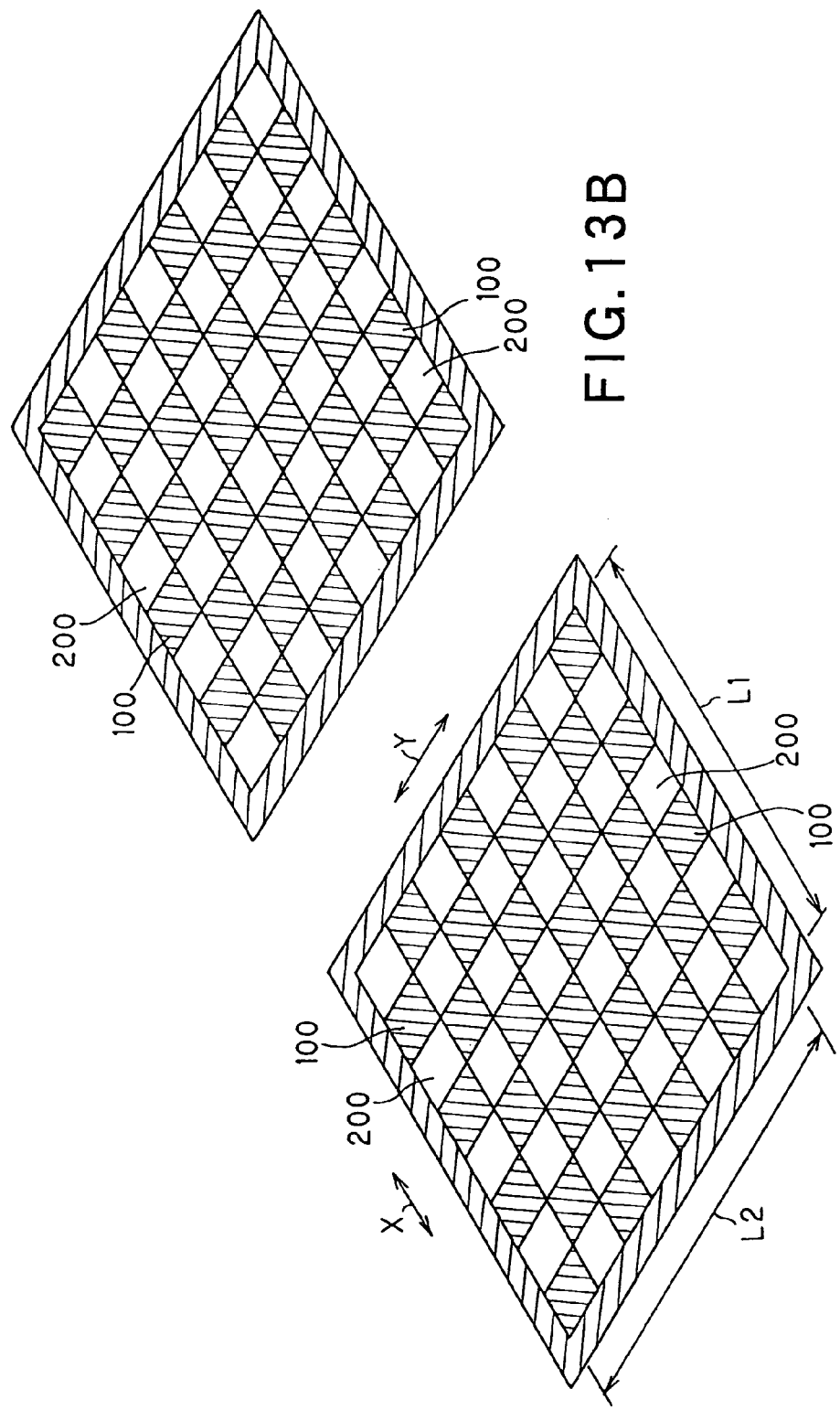

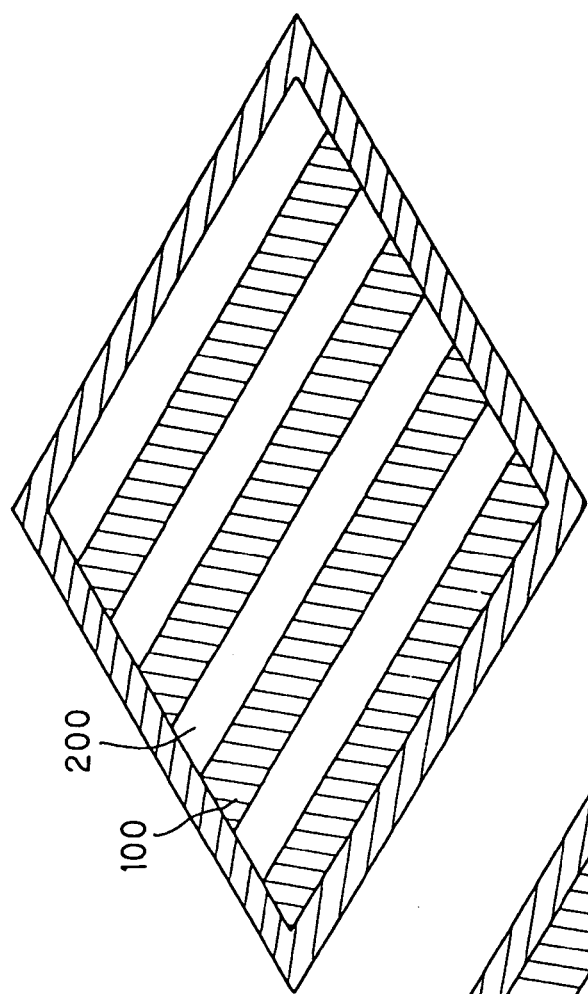
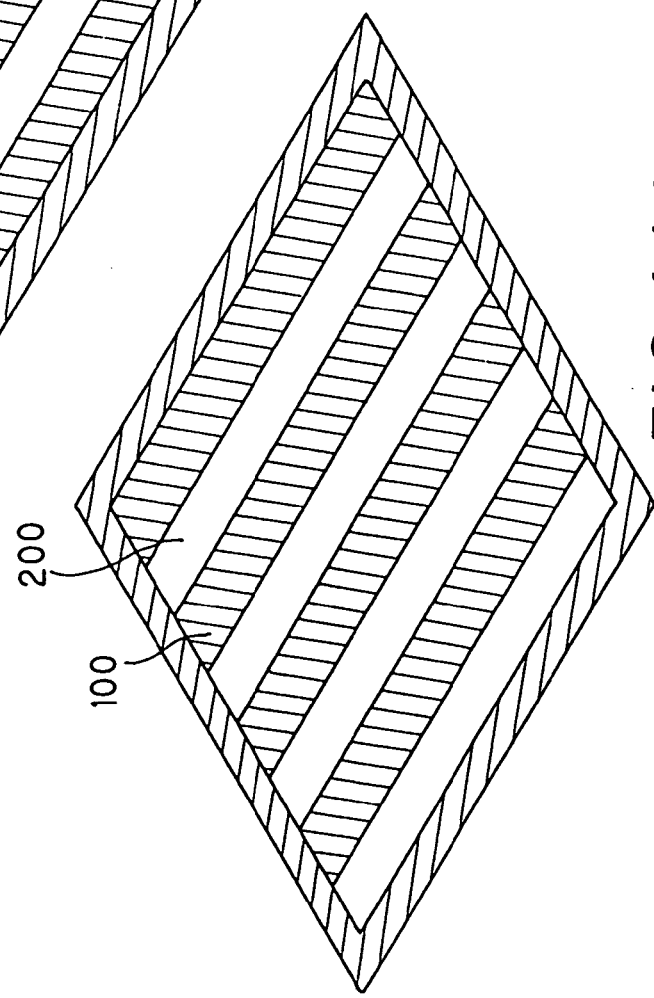
FIG. 14B
FIG. 14A

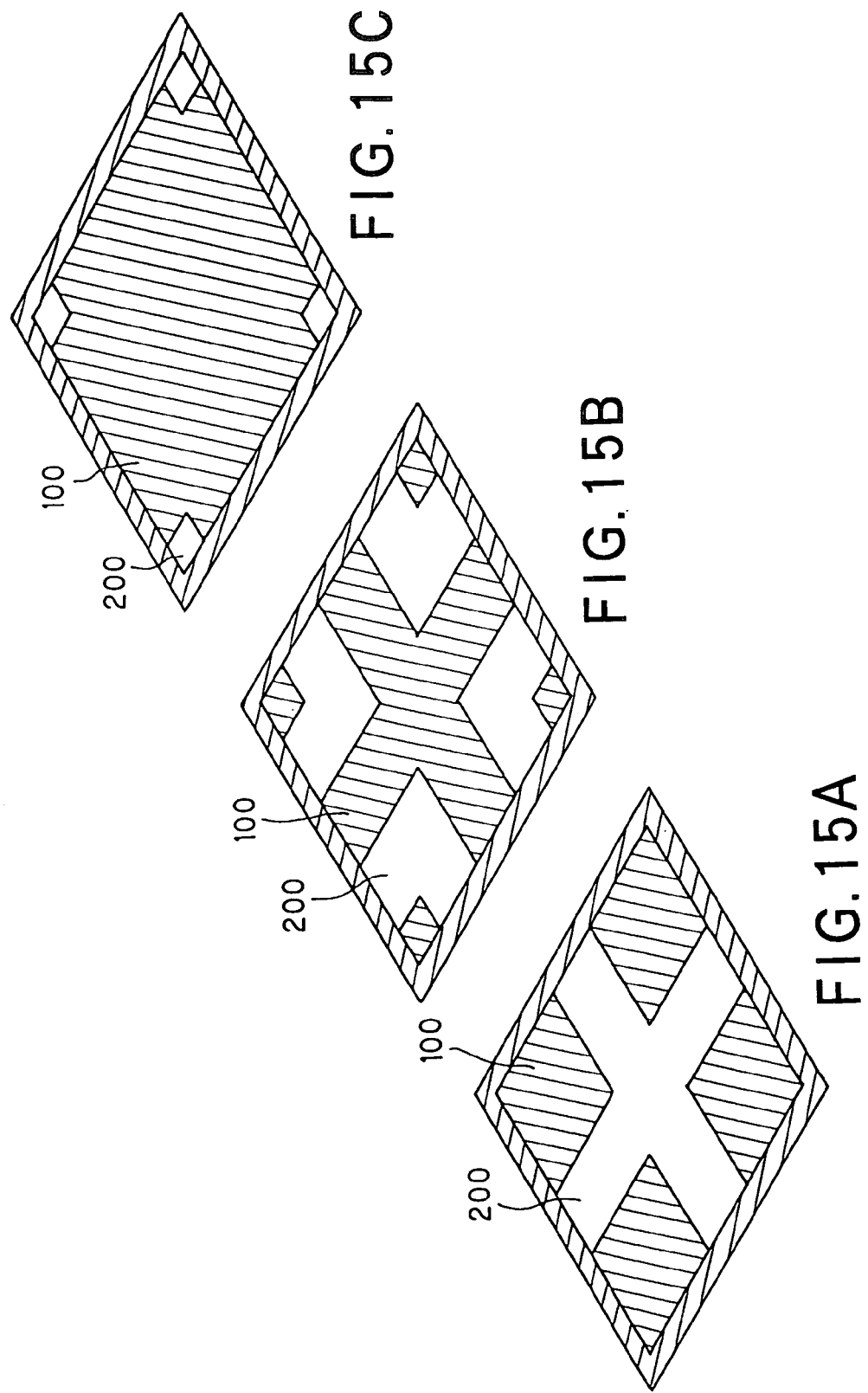

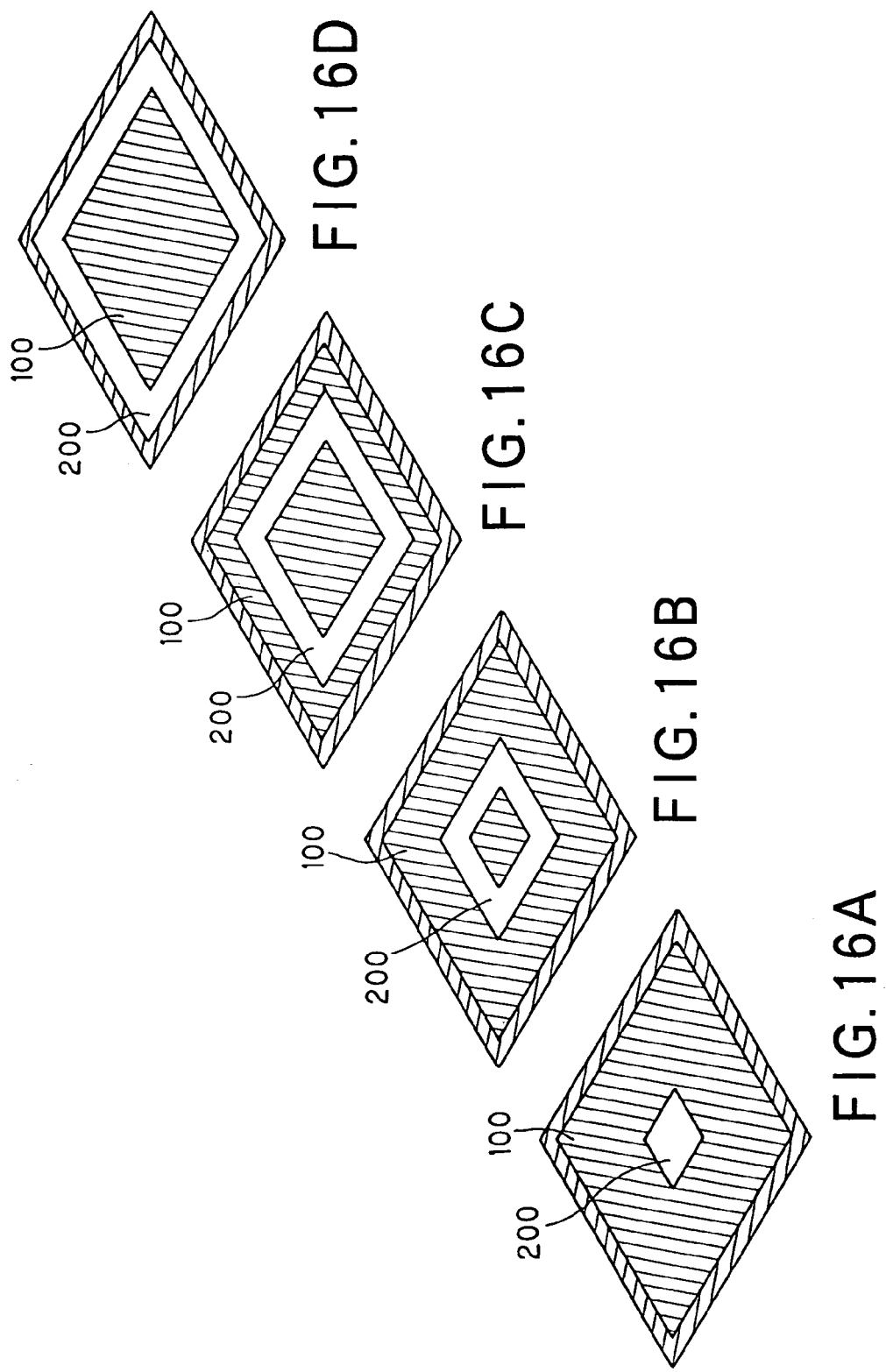

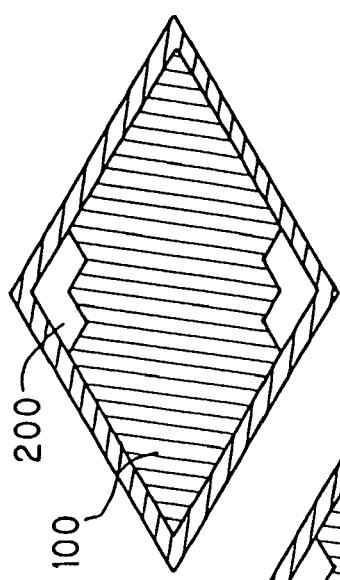
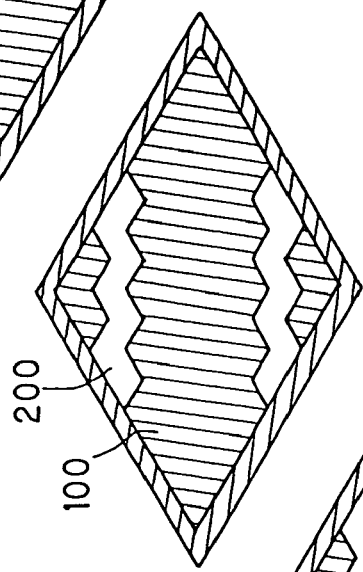
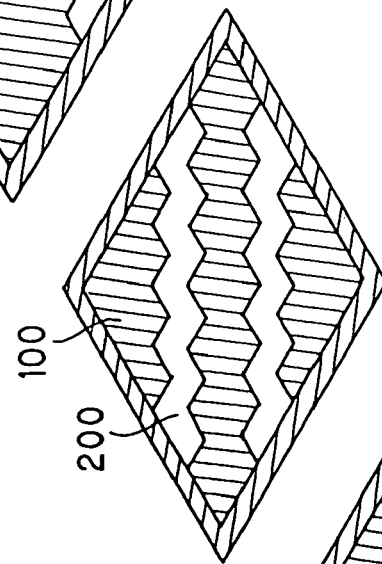
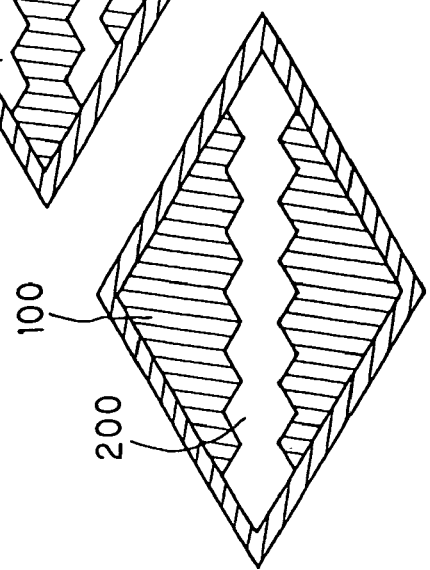
FIG. 17A
FIG. 17B
FIG. 17C
FIG. 17D

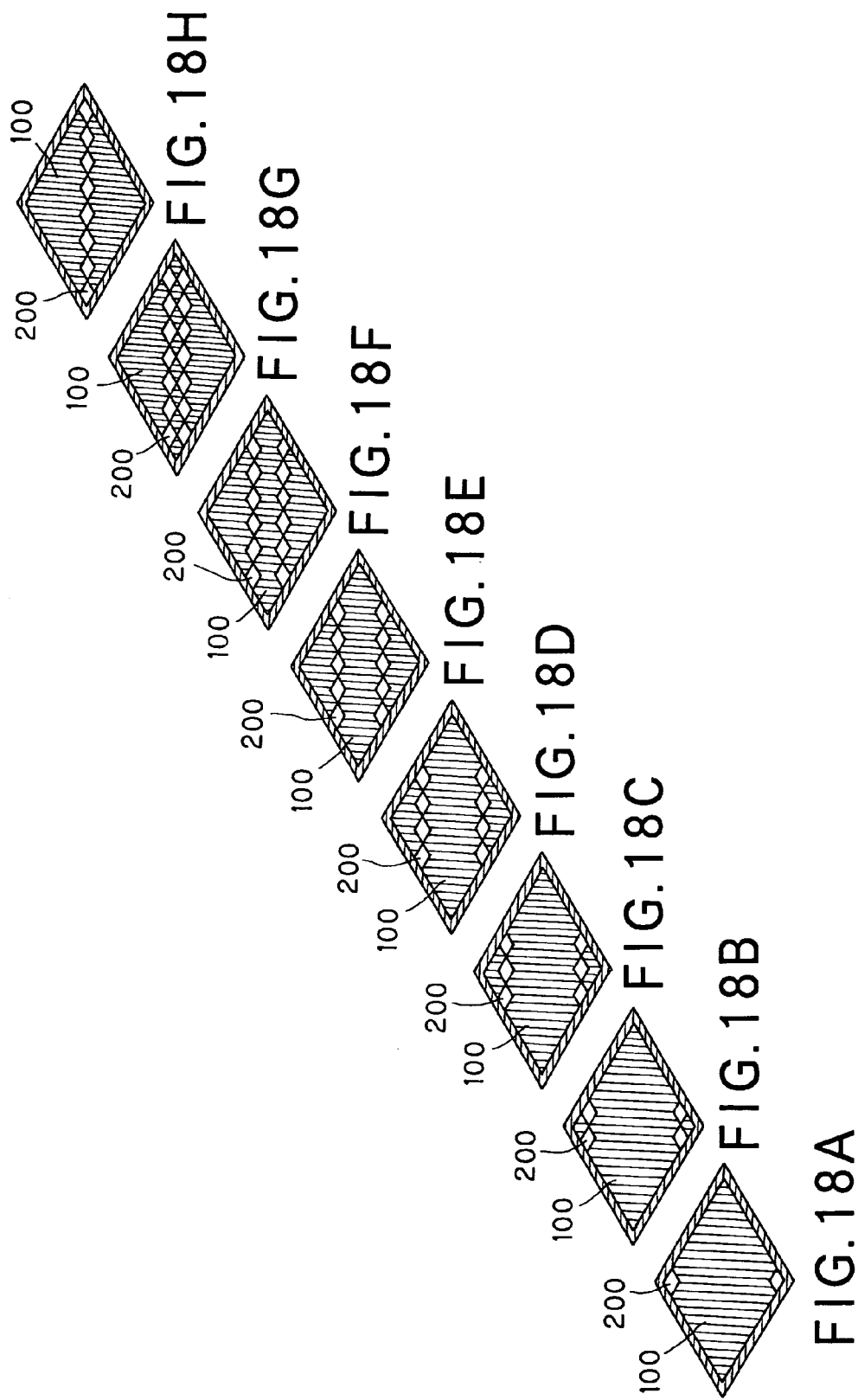

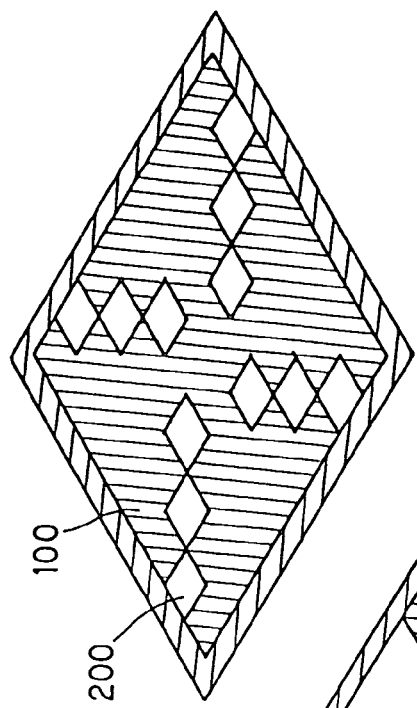
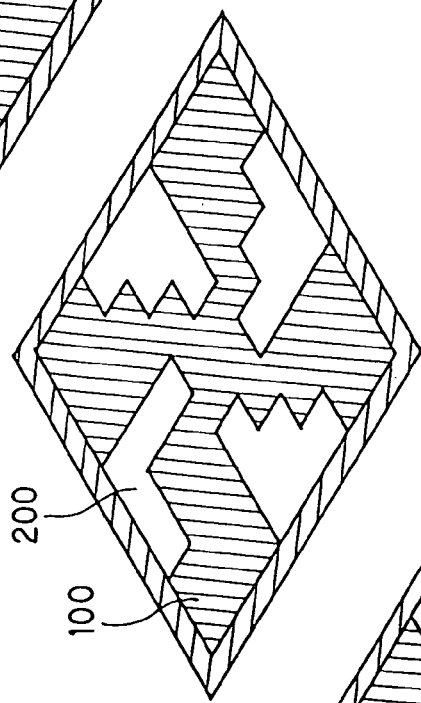
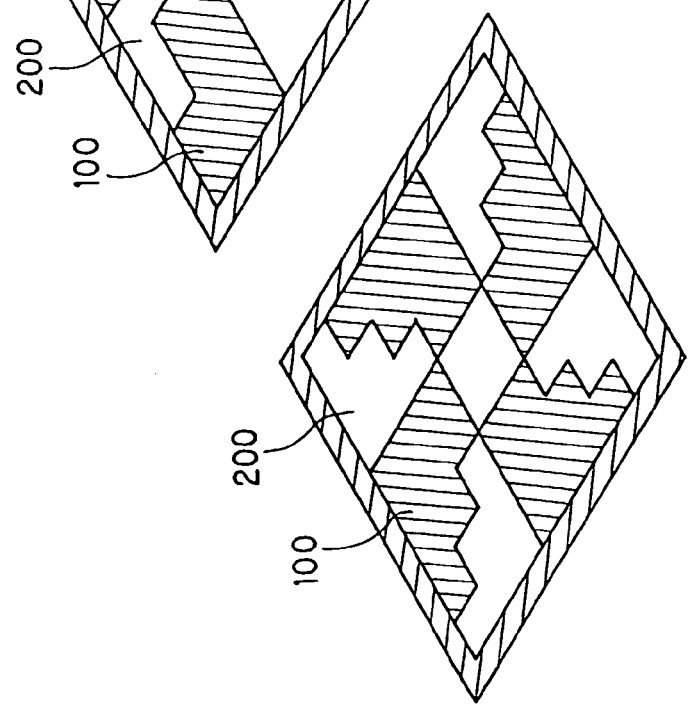
FIG. 19C
FIG. 19B
FIG. 19A

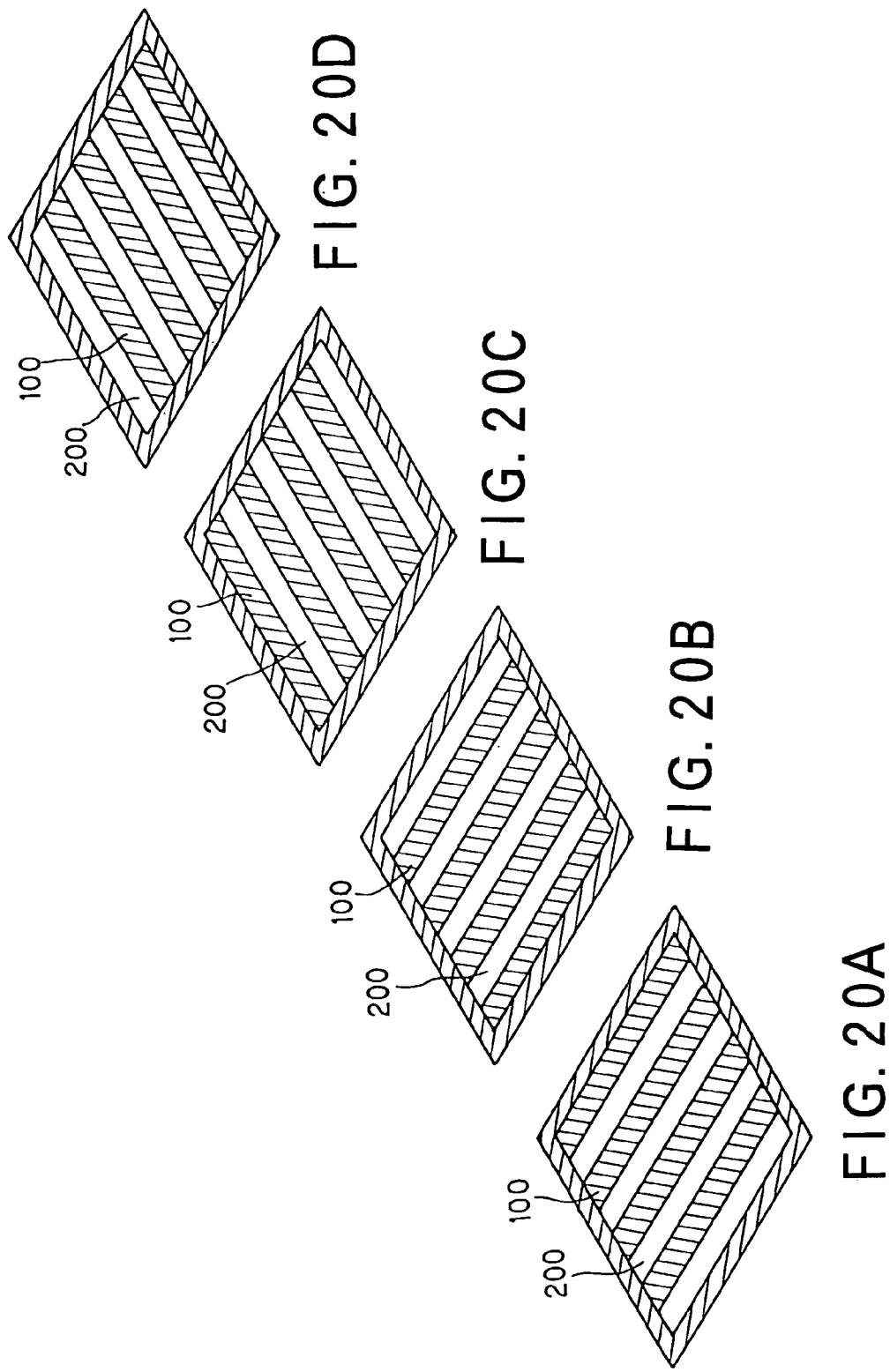

STEREOLITHOGRAPHIC APPARATUS AND METHOD FOR MANUFACTURING THREE-DIMENSIONAL OBJECT

BACKGROUND OF THE INVENTION

1. Field of the Invention

The present invention relates to stereolithographic apparatus and method for preparing a mask having a mask pattern, exposing a hardenable resin or the like through the mask pattern to hardening-promoting medium such as light, heat, pressure, electromagnetic waves or the like in the form of a plane to harden the hardenable resin or the like, thereby forming a three-dimensional object.

2. Description of the Related Art

A stereolithographic system using a photolithographic apparatus for optically manufacturing a three-dimensional object (hereinafter the process of forming a three-dimensional object by using stereolithography will be referred to as "stereolithographic molding") have been known in the art. The photolithographic apparatus generally includes a controller based on a three-dimensional computer-aided design (3D-CAD) for outputting stereolithographic data.

In the photolithographic apparatus, photohardenable resin is scanned and exposed by a laser beam from a semiconductor laser or the like in accordance with the above data from the controller to photoharden the photohadenable resin. In this case, however, the system has a disadvantage that it needs much time to expose each resin layer to light in order to harden the resin layer.

In recent years, another type of photolithographic system has been proposed to overcome the above disadvantage. The system performs the process comprising the steps of preparing a mask for high-speed stereolithography, and exposing the surface of each layer of hardenable resin (that is, an unhardened resin layer) to ultraviolet (UV) rays from an UV lamp in the form of a plane through the mask at a time (this exposure process will be hereinafter referred to as "plane exposure").

In order to perform the above exposure process, a mask pattern is formed on a light-transmissible member by using electrostatic toner to form a mask, the mask thus formed is superposed on a hardenable resin layer, and then UV rays are irradiated through the mask to the hardenable resin layer to thereby expose the hardenable resin to the UV rays in the form of a plane.

In the construction of the conventional system as described above, warp can be generated in the photohardenable resin as a result of shrinkage on hardening when the plane exposure is conducted on photohardenable resin (i.e., the photohardenable resin is exposed to UV rays in the form of a plane at a time). In this case, therefore, there is a trouble in which the stereolithographic molding accuracy is lowered more remarkably in comparison with so-called linear exposure using a laser beam.

Furthermore, in the above construction, since UV rays must irradiated through the mask to the unhardened resin layer while the mask is superposed on the unhardened resin layer, the edges of the finally hardened resin portion may be blurred (spread) due to the diffraction effect of light by the mask pattern, and thus the UV rays must be collimated to prevent the diffraction effect of the mask pattern.

In order to collimate the UV rays, the use of grid has been proposed. However, the amount of light might be reduced by about 10% if the grid is used, so that there is another problem that the hardening time will be increased by almost 10 times.

Alternatively, if the output power of the optical source is increased, the hardening time could be shortened. In this case however, working electric power will be increased, resulting in the increase in a running cost of the system.

In general, the light source may be selected from a mercury lamp, a metal halide lamp, an UV fluorescent lamp or the like. If such a light source is used, it stays on during the exposure. Thus, the exposure and interception of the light emitted from the light source to an exposure target must be controlled by using a shutter.

Any light source listed above has a large calorific value, so that an ambient temperature of the system can be extensively increased. Therefore, it is necessary to install some cooling device to prevent the system from overheating. In particular, otherwise, the shutter deforms with the heat of the light source, resulting in occurrence of some trouble such as a malfunction or the like.

SUMMARY OF THE INVENTION

An object of the present invention is to solve the above disadvantages and provide stereolithographic apparatus and method for forming a three-dimensional object, which allow the so-called plane exposure by a simple configuration without using grid or the like and reduce the calorific value of the light source without decrease in the stereolithographic molding accuracy.

Another object of the present invention is to provide stereolithographic apparatus and method for forming a three-dimensional object, which allow a plane exposure without decrease in the stereolithographic molding accuracy by preventing photohardenable resin from being warped due to shrinkage on hardening.

A further object of the present invention is to provide stereolithographic apparatus and method for forming a three-dimensional object by applying, in the form of a plane, at least any one of hardening-promoting media such as light, heat, pressure, electromagnetic waves, etc. onto hardenable resin or the like through a mask which is able to block the passage of the hardening-promoting medium to partially harden the hardenable resin or the like. The hardenable resin is formed of material which is hardenable upon application of at least one of the above hardening-promoting media.

In order to attain the above objects, according to a first aspect of the present invention, there is provided an optical stereolithographic apparatus for performing optical stereolithography by preparing a mask for partially intercepting light on the basis of stereolithographic data for each photohardenable resin layer obtained by slicing a three dimensional object, exposing each unhardened resin layer of photohardenable resin to light through the mask, and repeating the exposure operation to stereolithographically form the three-dimensional object, that is characterized by including an optical system for exposing the unhardened resin layer to light passing through the mask in the form of a plane while the unhardened resin layer and the mask are arranged so as to be spaced from each other at a predetermined distance.

In the optical stereolithographic apparatus, the optical system includes an illuminator for emitting light toward the unhardened resin layer, a lens for spreading the light emitted from the illuminator so that the light passing therethrough covers the overall area of the mask, the mask through which the light from the illuminator is partially passed and a projection lens which are arranged in this order so that the projection lens faces the unhardened resin layer, the unhardened resin layer of the photohardenable resin being exposed to light passing through the optical system.

In the optical stereolithographic apparatus, the optical system includes an illuminator for emitting light toward the unhardened resin layer, a lens for spreading the light emitted from the illuminator so that the light passing therethrough covers the overall area of the mask, and the mask through which the light from the illuminator is partially passed, which are arranged in this order, the unhardened resin layer of the photohardenable resin being exposed to light passing through the optical system. The optical stereolithographic apparatus further includes: a controller for outputting stereolithographic data of each layer on the basis of the data of the three-dimensional object; a mask forming unit for forming a mask in accordance with the stereolithographic data of each layer; and a resin layer forming unit for forming each unhardened resin layer of photohardenable resin, the resin layer forming unit being arranged so as to be spaced from the mask forming unit at a predetermined distance.

In the optical stereolithographic apparatus, the optical system includes an illuminator for emitting light toward the unhardened resin layer, and a focusing unit that is disposed between the resin layer forming unit and the mask forming unit and serves to focus the light passing through the mask onto the unhardened resin layer.

In the optical stereolithographic apparatus, the mask forming unit is a toner mask forming unit for electrostatically forming a mask with toner.

In the optical stereolithographic apparatus, the mask forming unit is a liquid crystal device for forming a mask with liquid crystal on the basis of voltage signals corresponding to stereolithographic data of each layer to be applied thereto.

In the optical stereolithographic apparatus, the mask forming unit forms at least one mask having different mask patterns, and the exposure on each unhardened resin layer is divided into plural sub exposure steps so that the exposure is stepwise carried out by using each of the plural mask patterns one by one.

In the optical stereolithographic apparatus, the optical system includes an illuminator for emitting light toward the unhardened resin layer, a lens for spreading the light emitted from the illuminator so that the light passing therethrough covers the overall area of each of the masks, each of the masks through which the light from the illuminator is partially passed, and a projection lens, which are arranged in this order so that the projection lens faces the unhardened resin layer, the unhardened resin layer of the photohardenable resin being exposed to light passing through the optical system.

In the optical stereolithographic apparatus, the optical system includes an illuminator for emitting light toward the unhardened resin layer, a lens for spreading the light emitted from the illuminator so that the light passing therethrough covers the overall area of each of the masks, and each of the masks through which the light from the illuminator is partially passed, which are arranged in this order, the unhardened resin layer of the photohardenable resin being exposed to light passing through the optical system.

In the optical stereolithographic apparatus, the mask forming unit is a toner mask forming unit for successively forming the plural mask patterns with toner electrostatically on the basis of the stereolithographic data of each layer.

In the optical stereolithographic apparatus, the mask forming unit is a liquid crystal device for successively forming the plural mask patterns with liquid crystal on the basis of voltage signals corresponding to the stereolithographic data of each layer to be applied thereto.

In the stereolithographic apparatus, the light source is selected from any one of a stroboscopic lamp, mercury lamp, a metal halide lamp, and a UV fluorescent lamp.

According to another aspect of the present invention, there is provided an optical stereolithographic method for performing optical stereolithography by preparing a mask for partially intercepting light from a light source on the basis of stereolithographic data for each photohardenable resin layer obtained by slicing a three dimensional object, exposing each unhardened resin layer of photohardenable resin to light through the mask, and repeating the exposure operation to stereolithographically form the three-dimensional object, that is characterized by further comprising the steps of: arranging the mask and the unhardened resin layer so that the mask and the unhardened resin layer are spaced from each other at a predetermined distance; and exposing the unhardened resin layer to light passing through the mask in the form of a plane.

The optical stereolithographic method as claimed in claim 14, further comprises the steps of: forming at least one mask having different mask patterns on the basis of the stereolithographic data of each photohardenable resin layer; and stepwise carrying out the exposure operation on each unhardened resin layer while the exposure operation is divided into plural sub exposure steps by using each of the plural mask patterns one by one until the exposure operation of each unhardened resin layer is completed. In the optical stereolithographic method, the plural mask patterns are successively formed with toner electrostatically on the basis of the stereolithographic data of each layer.

In the optical stereolithographic method, the plural mask patterns are formed by controlling a liquid crystal device on the basis of voltage signals corresponding to the stereolithographic data of each layer to be applied the liquid crystal device.

In the stereolithographic method as claimed in claim 15, the light source is selected from any one of a stroboscopic lamp, mercury lamp, a metal halide lamp, and a UV fluorescent lamp.

According to another aspect of the present invention, there is provided an optical stereolithographic apparatus for performing optical stereolithography by preparing a mask for partially intercepting light on the basis of stereolithographic data for each photohardenable resin layer obtained by slicing a three dimensional object, exposing each unhardened resin layer of photohardenable resin to light through the mask, and repeating the exposure operation to stereolithographically form the three-dimensional object, that is characterized by including: a controller for outputting stereolithographic data of each layer on the basis of the data of the three-dimensional object; a mask forming unit for forming at least one mask having different mask patterns, wherein the exposure on each unhardened resin layer is divided into plural sub exposure steps so that the exposure is stepwise carried out by using each of the plural mask patterns one by one. In the optical stereolithographic apparatus, the mask forming unit is a toner mask forming unit for successively forming the plural mask patterns with toner electrostatically on the basis of the stereolithographic data of each layer.

In the optical stereolithographic apparatus, the mask forming unit is a liquid crystal device for successively forming the plural mask patterns with liquid crystal on the basis of voltage signals corresponding to the stereolithographic data of each layer to be applied thereto.

According to another aspect of the present invention, there is provided an optical stereolithographic method for performing optical stereolithography by preparing a mask for partially intercepting light from a light source on the basis of stereolithographic data for each photohardenable resin layer obtained by slicing a three dimensional object, exposing each unhardened resin layer of photohardenable resin to light through the mask, and repeating the exposure operation to stereolithographically form the three-dimensional object, that is characterized by further comprising the steps of: forming at least one mask having different mask patterns on the basis of the stereolithographic data of each photohardenable resin layer; and stepwise carrying out the exposure operation on each unhardened resin layer while the exposure operation is divided into plural sub exposure steps by using each of the plural mask patterns one by one until the exposure operation of each unhardened resin layer is completed.

In the optical stereolithographic method, the plural mask patterns are successively formed with toner electrostatically on the basis of the stereolithographic data of each layer.

In the optical stereolithographic method, the plural mask patterns are formed by controlling a liquid crystal device on the basis of voltage signals corresponding to the stereolithographic data of each layer to be applied the liquid crystal device.

In the stereolithographic method, the light source is selected from any one of a stroboscopic lamp, mercury lamp, a metal halide lamp, and a UV fluorescent lamp.

According to another aspect of the present invention, there is provided a stereolithographic apparatus for stereolithographically forming a three-dimensional object by exposing a hardenable material layer to hardening-promoting medium in the form of a plane through a mask having a mask pattern for partially intercepting passage of the hardening-promoting medium therethrough to thereby partially harden the hardenable material layer and repeating the exposure operation while a hardenable material layer is successively stacked on another hardenable material layer, whereby the three-dimensional object comprising the respective hardened material layers is formed, that is characterized by comprising: a controller for generating and outputting stereolithographic data of each hardenable material layer on the basis of the data of the three-dimensional object; and a mask forming unit for forming at least one mask having different mask patterns, wherein the exposure operation on each unhardened material layer is divided into plural sub exposure steps so that the exposure is stepwise carried out by individually using each of the plural mask patterns one by one.

In the stereolithographic apparatus, the mask forming unit is a toner mask forming unit for successively forming each of the plural mask patterns on the at least one mask with toner electrostatically on the basis of the stereolithographic data of each hardenable material layer.

In the stereolithographic apparatus, the mask forming unit is a liquid crystal device for successively forming each of the plural mask patterns on the at least one mask by controlling a voltage to be applied to liquid crystal on the basis of the stereolithographic data of each hardenable material layer.

In the stereolithographic apparatus, the hardening-promoting medium is selected from light, UV rays, heat, pressure, electromagnetic waves, and chemical components, and the material of the hardenable material layer is composed of any material which is hardened by applying the hardening-promoting medium to the material.

According to another aspect of the present invention, there is provided a stereolithographic method for stereolithographically forming a three-dimensional object by exposing a hardenable material layer to hardening-promoting medium in the form of a plane through a mask having a mask pattern for partially intercepting passage of the hardening-promoting medium therethrough to thereby partially harden the hardenable material layer and repeating the exposure operation while a hardenable material layer is successively stacked on another hardenable material layer, whereby the three-dimensional object comprising the respective hardened material layers is formed, that is characterized by comprising the steps of: generating and outputting stereolithographic data of each hardenable material layer on the basis of the data of the three-dimensional object; forming at least one mask having different mask patterns on the basis of stereolithographic data of each hardenable material layer; and exposing each unhardened material layer to the hardening-promoting medium in plural steps while the exposure operation is divided into plural sub exposure steps and each sub exposure step is carried out by individually using each of the plural mask patterns.

In the stereolithographic apparatus, the mask forming step is carried out by successively forming each of the plural mask patterns on the at least one mask with toner electrostatically on the basis of the stereolithographic data of each hardenable material layer.

In the stereolithographic apparatus, the mask forming step is carried out by successively forming each of the plural mask patterns on the at least one mask by controlling a voltage to be applied to liquid crystal on the basis of the stereolithographic data of each hardenable material layer.

In the stereolithographic apparatus, the hardening-promoting medium is selected from light, UV rays, heat, pressure, electromagnetic waves, and chemical components, and the material of the hardenable material layer is composed of any material which is hardened by applying the hardening-promoting medium to the material.

BRIEF DESCRIPTION OF THE DRAWINGS

The above and other objects, effects, features and advantages of the present invention will be more apparent from the following description of embodiments thereof taken in conjunction with the accompany drawings.

FIGS. 12A and 12B are schematic views showing the respective mask patterns to be formed by the liquid crystal element shown in FIG. 11;

FIGS. 13A and 13B are schematic views showing other mask patterns to be formed by the liquid crystal element shown in FIG. 11, respectively;

FIGS. 14A and 14B are schematic views showing other mask patterns to be formed by the liquid crystal element shown in FIG. 11, respectively;

FIGS. 15A, 15B, and 15C are schematic views showing other mask patterns to be formed by the liquid crystal element shown in FIG. 11, respectively;

FIGS. 16A, 16B, 16C, and 16D are schematic views showing other mask patterns to be formed by the liquid crystal element shown in FIG. 11, respectively;

FIGS. 17A, 17B, 17C, and 17D are schematic views showing other mask patterns to be formed by the liquid crystal element shown in FIG. 11, respectively;

FIGS. 18A to 18H are schematic views showing other mask patterns to be formed by the liquid crystal element shown in FIG. 11, respectively;

FIGS. 19A, 19B, and 19C are schematic views showing other mask patterns to be formed by the liquid crystal element shown in FIG. 11, respectively;

FIGS. 20A to 20D are schematic views showing other mask patterns to be formed by the liquid crystal element shown in FIG. 11, respectively.

DETAILED DESCRIPTION OF PREFERRED EMBODIMENTS

Preferred embodiments according to the present invention will be described with reference to the accompanying drawings.

In the following embodiments, optical stereolithographic apparatus and method for optically forming a three-dimensional object in a stereolithographic process by successively irradiating light (as a hardening-promoting medium) to each photohardenable resin layer in the form of a plane through a mask will be representatively described. However, the stereolithographic apparatus and method of the present invention are not limited to the optical stereolithographic apparatus and method. For example, the present invention may be applied to any wider-concept stereolithographic apparatus and method insofar as a three dimensional object is stepwise formed by using materials that are hardened (or softened, liquefied or gasified) when physical or chemical phase-shifting media (when hardenable resin is used, hardening-promoting media (stimuli) such as light, heat, pressure, electromagnetic waves, chemical components, etc.) are applied to the phase-shifting materials through a mask having a mask pattern thereon.

Figure 1:
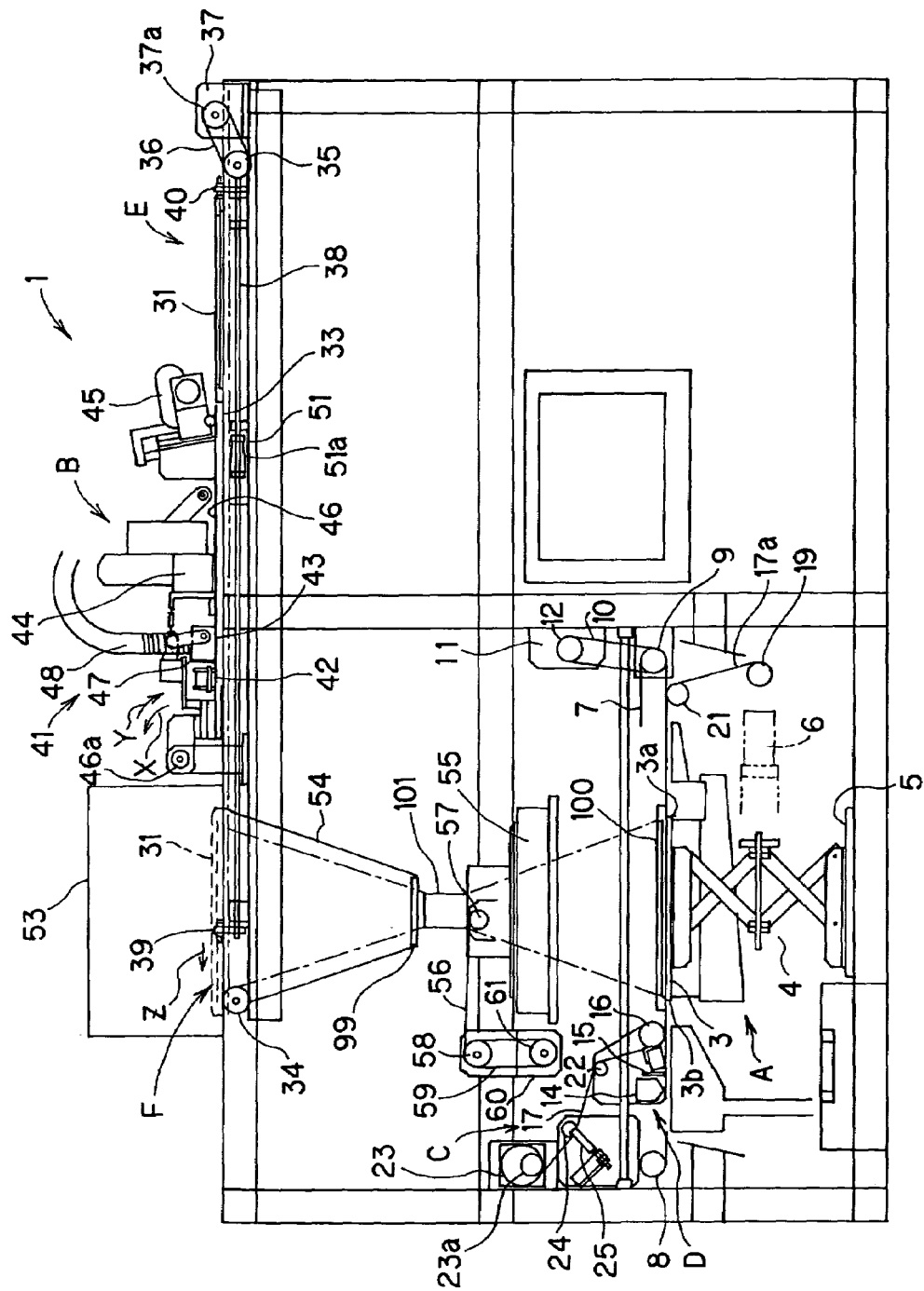
FIG. 1 is a front view showing a stereolithographic apparatus according to an embodiment of the present invention.

FIG. 1 is a front view showing a stereolithographic apparatus according to an embodiment of the present invention.

In FIG. 1, reference numeral 1 denotes an optical stereolithographic apparatus that comprises a molding stage "A" arranged on the bottom step of the apparatus, a mask preparation stage "B" arranged on the upper step of the apparatus, and a supply stage "B" arranged on the left side of the molding stage "A" in FIG. 1 to supply photohardenable resin.

The optical stereolithographic apparatus 1 further comprises a controller (not shown) that consists of a three dimensional computer aided design (3D-CAD) system or the like.

The mask preparation stage "B" on the upper step of the apparatus prepares a mask on a light-transmissible material such as glass or the like on the basis of optical stereolithographic data of each layer (slice) of a three dimensional object to be formed, which is output from the controller. On the other hand, the supply stage "C" has a unit "D" for the supply of photohardenable resin. The unit "D" moves to the stage "A" and applies one layer of photohardenable resin onto a stereolithographic object under molding which is placed on the stage "A", thereby forming an unhardened resin layer thereon.

A predetermined space is kept between the molding stage "A" and the mask preparation stage "B" (an exposure stage "F" described below). The optical stereolithography is performed by irradiating light to an unhardened resin layer on the bottom step of the apparatus in the form of a plane (i.e., plane-exposure) through a mask by using an optical system of a projector described later.

Figure 2:
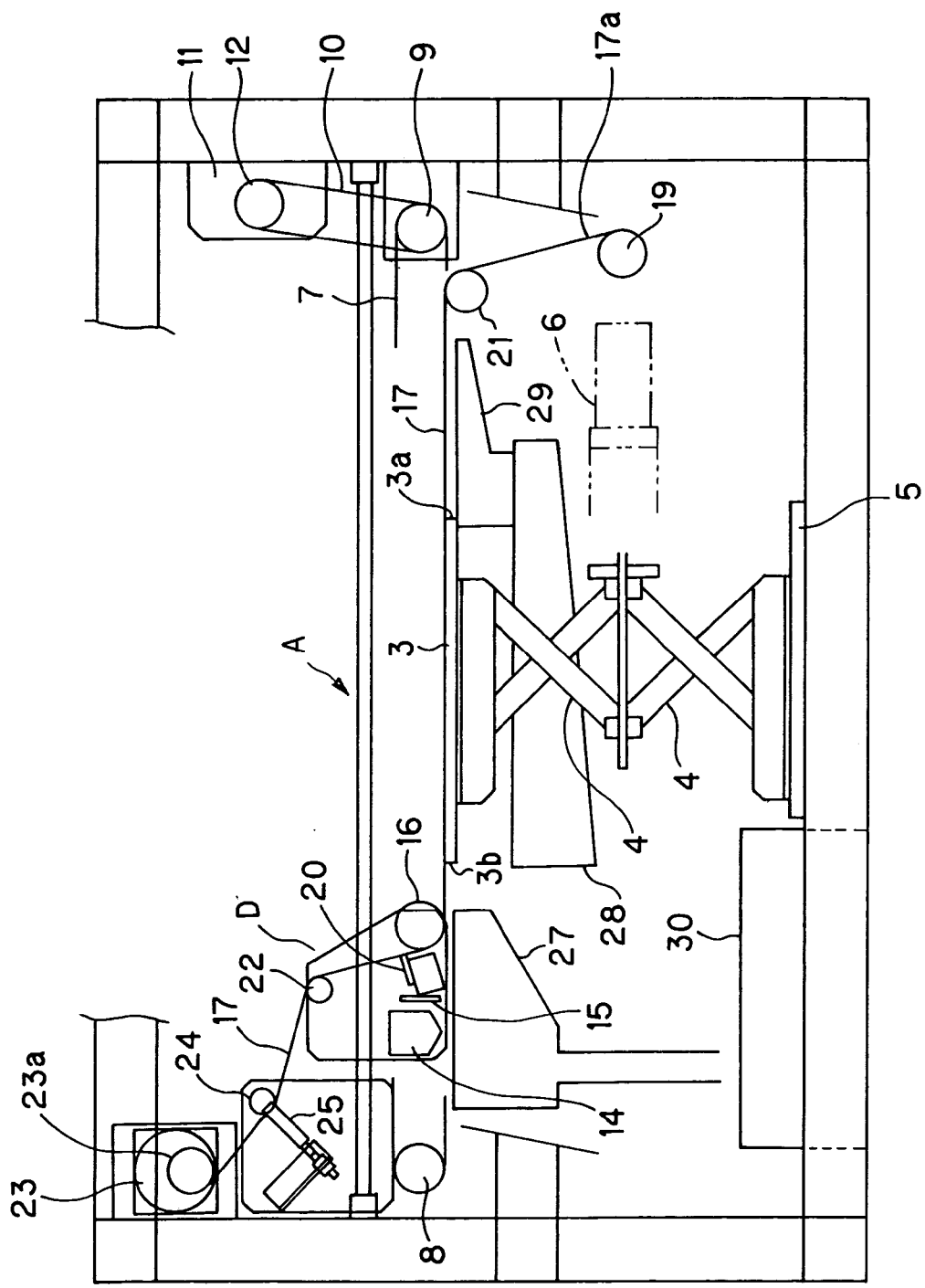
FIG. 2 is a front view showing a stereolithographic stage of the stereolithographic apparatus shown in FIG. 1.

As shown in FIG. 2, the above molding stage A includes a molding table 3. The molding table 3 includes a base 4 on which two extendable links each having a substantially "X" shape are placed so as to be coupled to each other and so that one is stacked on the other. The extendable links 4 are connected to an output shaft of a servo motor 6. The extendable links 4 shrink upon actuating the servo motor 6 so that the molding table 3 can be freely controlled to be downwardly moved every one layer.

A stainless steel plate is laminated on the top face of the above molding table 3 and then the first unhardened resin layer described below is directly coated on this top face.

Furthermore, a stereolithographic article is optically formed on the molding table 3 in the process including the following steps. First, the unit "D" located on the supply stage "C" is actuated to form one layer of unhardened resin on the molding table 3 (or a stereolithographic article being formed). The unit "D" is connected to a timing belt 7 that runs between a pair of sprocket wheels 8, 9. In addition, another timing belt 10 is also hung on one of the wheel 9, and it is also hung on a sprocket wheel 12 of a driving motor 11. Therefore, the unit "D" moves along the timing belt 7 in a left or right direction in the figure as the driving motor 11 runs in a clockwise or counterclockwise direction.

The unit "D" comprises a resin-supply dipper 14 for stocking hardenable resin and supplying a predetermined amount of resin when the layer formation is performed, a coating blade 15 for smoothening the liquid level of the applied resin, and an exfoliating/attaching roller 16 to be used for exfoliating a light-transmissible polyester film 17 from the resin layer or attaching the light-transmissible polyester film 17 to the resin layer. The above polyester film 17 is stretched from one end 3a to the other end 3b of the molding table 3. A roller 19 having a torque limiter is installed on the outside of the one end 3a of the molding table 3. One end 17a of the file 17 is wound around the roller 19. The other end 17b of the film 17 is wound around a roller 23a of the film replacement motor 23 via the roller 21, the film replacement roller 16, and the roller 22. In addition, reference numeral 24 denotes a tension roller that is connected to a rod of an air cylinder 25 and is urged in such a direction as to apply a tension to the film 17.

Next, the operation of the unit "D" will be described in detail.

Figure 3:
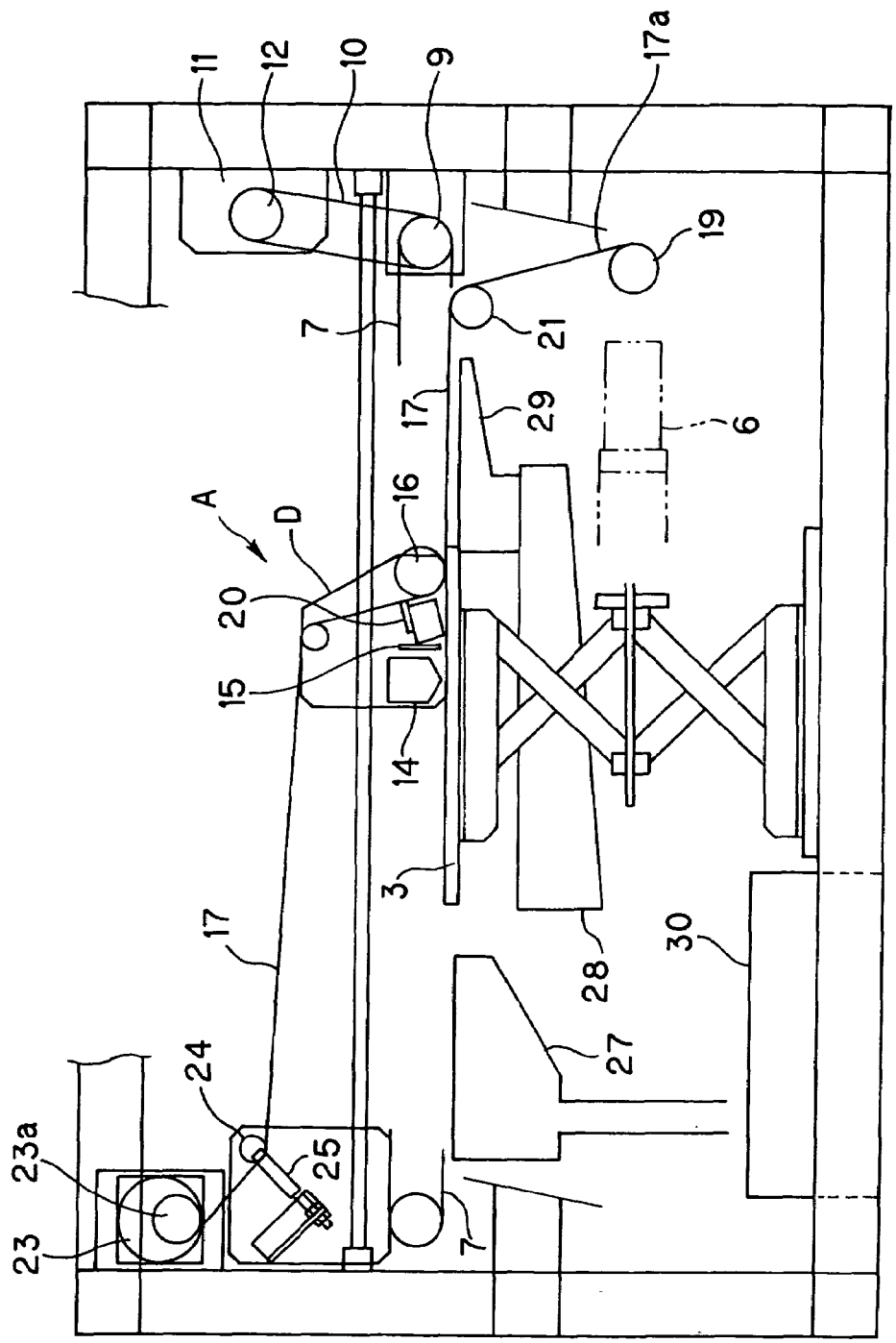
FIG. 3 is a front view showing the movement of units of the stereolithographic apparatus shown in FIG. 1.

When the driving motor 11 at the upper right side of FIG. 2 is rotated in a forward direction, the unit "D" is transferred from the position shown in FIG. 2 to the position shown in FIG. 3.

During this transfer, the film 17 is exfoliated from the resin layer while pressed down 17 by the roller 16. In this manner, the film 17 is exfoliated while pressed down as described above, so that the resin layer on which the film 17 is stuck is never torn off from the molding table 3 along with the film 17. When the film 17 is exfoliated, some resin may be stuck to the lower surface of the film 17. In this case, however, a blade 20 provided on the unit "D" could remove such undesired resin.

Concurrently with the removal of the film 17, additional resin is supplied from the resin supply dipper 14 and applied onto the molding article to form an additional unhardened resin layer thereon.

The unit "D" is transferred to the right end in FIG. 2 by the timing belt 7. Upon reaching the right end, the molding table 3 is lowered by the amount corresponding to the thickness of one layer of the resin.

Subsequently, the driving motor is rotated in a reverse direction so that the unit "D" returns along the timing belt 7 from the position shown in FIG. 3 to the position shown in FIG. 2. In the course of the reverse transfer, an excess amount of the resin is removed by the coating blade 15 to flat the height of resin's liquid level uniformly. The film 17 can be stuck on the resin while pressed down by the roller 16. Accordingly, the resin's liquid level is kept at a constant height and the resin is held at that position.

In short, the film 17 is placed on the resin to hold the resin. Therefore, it is not limited to the film 17, and it is also possible to use, for example, a light-transmissible sheet material or the like that has the function of holding the resin as it is.

In the above process, the film 17 may be damaged. For example, when the thickness of the resin-forming layer on the molding table 3 is thinner than usual, the film 17 may come into contact with an edge of the molding table 3 and be damaged by the edge. If the film 17 is damaged, a re-sticking motor 23 located at the left side in FIG. 2 is driven to lead out the film 17 wound around the roller 19 with the torque limiter. As a result, the accessible area of the film 17 is changed.

In the moving range of the unit "D", there is a possibility that the resin supplied from the resin supply dipper 14 drips. For recovering this resin, tanks 27, 28, and 29 are provided to cover substantially the whole area at the lower side of the moving range of the unit "D". The resin withdrawn by these tanks 27, 28, and 29 are further withdrawn by a return tank 39. The return tank 30 stores the resin therein, and then the resin may be supplied to the resin supply dipper 14 via a supply system (not shown) if necessary.

In the molding stage A, when the film 17 is placed over the surface of an unhardened resin layer, a pressing glass plate 108 (FIG. 1) is arranged so as to be brought into close contact with the film 17.

In the above mask preparation stage B, as shown in FIG. 1, a mask preparing means 41 is provided to prepare a mask by applying toner onto the light-transmissible material (glass) 31. The mask preparing means 41 includes a magnetic eraser head 42, a toner scraper 43, an electrostatic charge head 44, and a developer 45. The electrostatic charge head 44 is controlled in accordance with the data corresponding to one layer, which can be produced as an output from the controller (not shown). The mask preparation means 41 is mounted on a frame 46 that is fixed to a fixed part of the apparatus by means of a hinge connection using a pin 46a. The mask preparation means 41 is able to move upwardly and downwardly with the frame 46 with the pin 46a acting as a fulcrum. The toner scraper 43 is covered with a cover 47 that is connected to a toner suction hose 48.

The toner is preferably mixed with silicon oxide, aluminum oxide, titanium oxide or the like as UV absorbing material. The UV absorbance is set to 10% or more, preferably 30% or more, and more preferably 50% or more.

At the side of the mask preparation stage "B" is provided a light-transmissible material waiting stage "E". Thus, the above glass 31 moves reciprocatively in the forward and backward direction along the light-transmissible material waiting stage "E", the mask preparation stage "B", and the exposure table "F" in this order. That is, a pair of belts 33 that can be rotationally driven are provided so as to turn around the light-transmissible material waiting stage "E", the mask preparation stage "B" and the exposure table "F" and extend in two lines. The belts 33 run between pulleys 34, 35, and one pulley 35 is coupled to a pulley 37a of the driving motor 37 through a belt 36.

A projection (not shown) formed on the lower surface of the glass 31 is hooked on the above belts 33. Thus, when the driving motor 37 is driven in the forward or reverse direction, the belts 33 move in the forward or reverse direction so that the glass 31 travels between the above stages reciprocatively.

A single operating bar 38 is installed so as to extend among the stages "E", "B", and "F". In addition, stoppers 39, 40 are fixed to both the ends of the operating bar 138, respectively. When the above glass 31 moves into the light-transmissible material waiting stage "E" and touches the stopper 40 (in the state shown in FIG. 1), the operating bar 38 is pushed by the glass 31 to be moved to the right side in FIG. 1. Then, a cam member 51 fixed in the middle of the operating bar 38 is also moved to the right side in FIG. 1 integrally with the movement of the operating bar 38. By means of a cam surface 51a, which is an inclined plane of the cam member 51, the above mask preparation means 41 is leaped up together with the frame 46 in the direction of the arrow "X" with the pin 46 acting as the fulcrum.

On the other hand, when the glass 31 moves into the exposure stage "F" and abuts against the stopper 39, the operating bar 38 is pushed by the glass 31 and moved to the left side (in the direction of the arrow "Z") in FIG. 1. Then, a cam member 51 fixed in the middle of the operating bar 38 is also moved to the left side in FIG. 1 integrally with the operating bar 38. Along the inclined cam surface 51a of the cam member 51, the above mask preparation means 41 is moved downwardly together with the frame 46 in the direction of the arrow "X" with the pin 46a acting as the fulcrum.

Next, the operation of preparing a mask on the glass 31 will be described in detail.

The mask is prepared in the process of transferring the glass 31 from the exposure stage "F" to the light-transmissible material waiting stage "E". In this case, as described above, the mask preparation means 41 moves downwardly to the position where the mask is prepared.

When the glass plate 31 enters the mask preparation stage "B", the surface of the glass plate 31 is demagnetized by the magnetic eraser head 42 at first and then the toner scraper 43 removes the previous toner being left on the glass plate 31. Subsequently, the electrostatic charge head 44 is controlled in accordance with the stereolithographic data for one layer, which is produced as an output from the controller (not shown). As a result, the surface of the glass plate 31 is charged on the basis of the data for one layer. Subsequently, toner particles are applied onto the surface of the glass plate 31 by the developer 45 to form a mask (mask pattern) thereon. Then, the masked glass plate is transferred to the light-transmissible material waiting stage "E".

When the glass plate 31 is transferred to the light-transmissible material waiting stage "E", the mask preparation means 41 is leaped up as described above and a gap is formed under the mask preparation means 41. When the masked glass plate 31 is transferred from the light-transmissible material waiting stage "E" to the exposure stage "F", it passes through the gap. Then, when the glass plate 31 arrives at the exposure stage "F" and abuts against the stopper 39, the mask preparing means 41 is moved down to the position at which the mask is prepared and then it is kept on standby at that position.

At the upper side of the exposure stage "F" is provided an exposure device (illuminator) 53 that performs a plane exposure on photohardenable resin through the mask formed on the glass plate 31. The exposure device 53 accommodates therein a light source such as a mercury lamp, a metal halide lamp, an UV fluorescent lamp or the like.

The light from the exposure device 53 passes through the glass plate 31 and propagates through the inside of a fixed cover member 54 extending downwardly from the exposure stage "F". The light further passes through a shutter 99 and a project lens 101 described below and also the inside of fixed or retractable hood 55, and then passes through a press glass plate 108 to perform plane exposure to the photohardenable resin.

Figure 4:
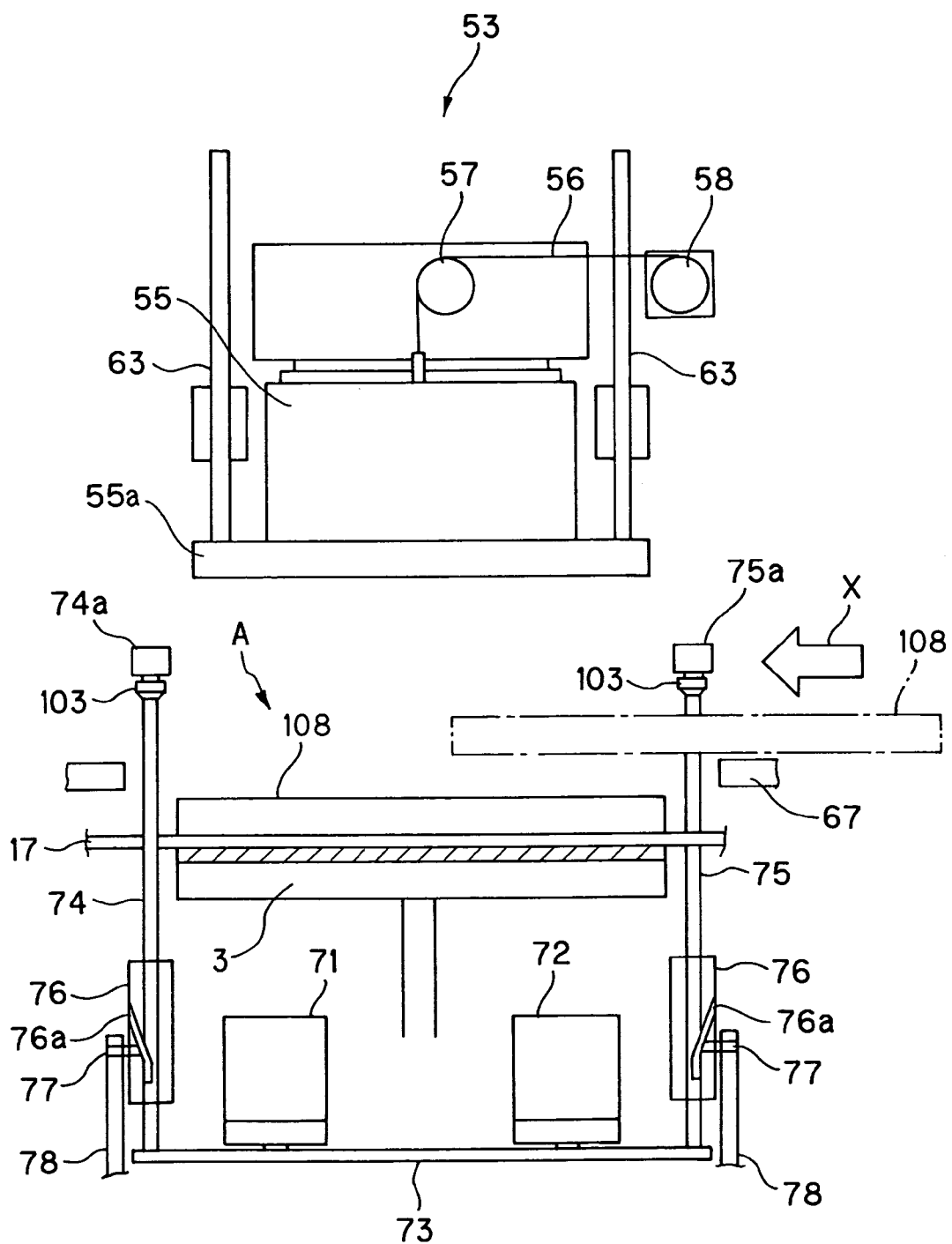
FIG. 4 is a front view showing a positioning with the stereolithographic stage.

As shown in FIG. 4, the hood 55 is hung with a wire 56 that is connected to a take-up pulley 58 through a fixed pulley 57. That is, a belt 59 runs between the take-up pulley 58 and a pulley 61 fixed on the output shaft of the motor 60.

Figure 5:
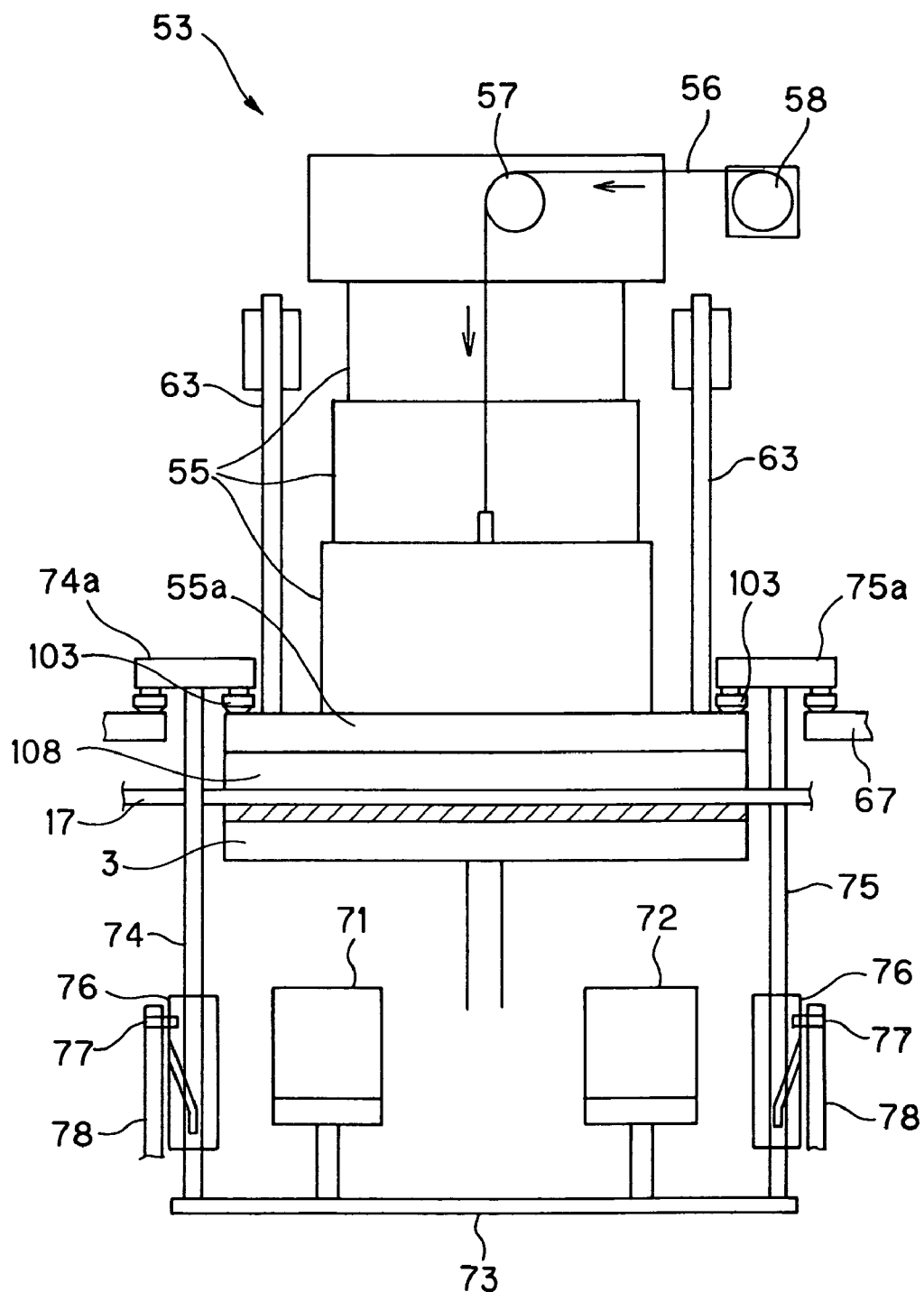
FIG. 5 is a front view showing the condition in which a hood of an illuminator is moved downwardly.

In this embodiment, the hood 55 can be moved upwardly and downwardly as shown in FIG. 4 and FIG. 5 by rotating the motor 61 in the forward and reverse directions.

When the hood 55 is moved downwardly and it covers the press glass plate 108 and the resin, the hood 55 and the press glass plate 108 are positioned in an appropriate arrangement in the molding stage "A". In FIG. 4 and FIG. 5, reference numeral 63 denotes a guide post.

Referring to FIG. 4, a pair of cylinders 71, 72 is arranged under the molding table 3. A horizontal bar 73 is connected to a rod of each cylinder 71, 72. In addition, a pair of operating rods 74, 75 is connected to both ends of the horizontal bar 73 so that each of the operation rods 74, 75 extends in a vertical direction and freely rotates around the axis. A sleeve 76 is fixed on the circumference of each operating rod 74, 75. A lead groove 76a is formed in the circumference of this connecting sleeve 76. The lead groove 76a is extended in a spiral shape while a pin 77 fixed to the fixing member 78 fits in the lead groove 76a.

The press glass plate 108 is held on guide rails 67 and transferred to the molding table 3 in the direction of the arrow X in FIG. 4. when the press glass plate 108 is superposed on the film 17, the molding table 3 is controlled to descend by the amount corresponding to only one layer, followed by the descent of the hood 55.

When the lower edge 55a of the hood 55 abuts against the press glass plate 108, the rod of each cylinders 71, 72 extends to depress the horizontal bar 73 as shown in FIG. 5, As a result, the pair of the operating rods 74, 75 moves downwardly integrally with each other.

In this descending process, the operating rods 74, 75 turn around the shaft along the shape of the lead grooves 76a. Stators 74a, 75a on the top end of the respective operating rods 74, 75 change their orientation from one shown in FIG. 4 to the other shown in FIG. 5. Consequently, a projection 103 of each stator 74a, 75a pushes down the lower edge 55b of the hood 55 to fix the hood in position.

After completing the optical stereolithography for one layer at the molding stage "A", the glass plate 31 is transferred to the mask preparation stage "B" as described above.

Figure 6:
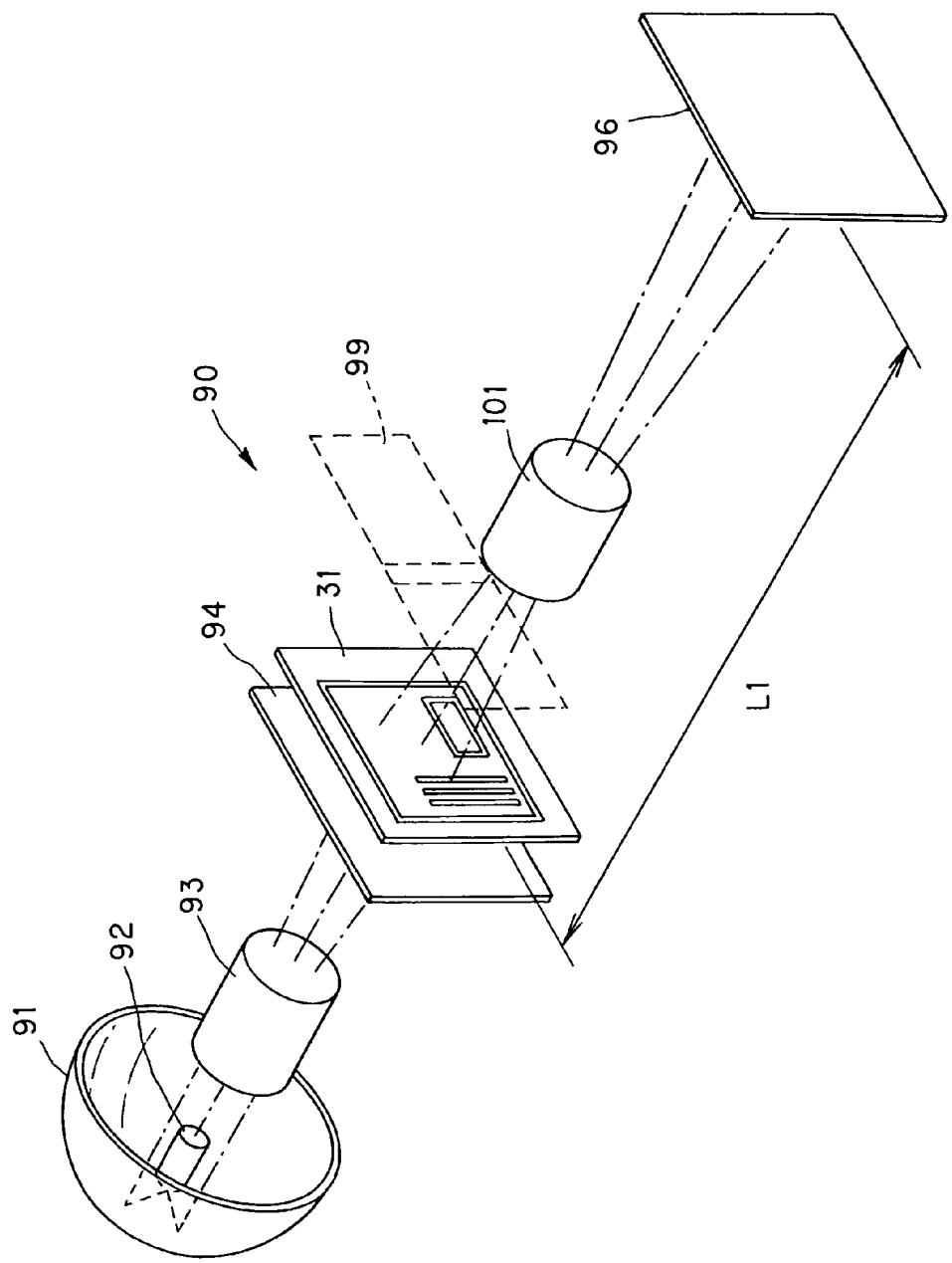
FIG. 6 is a perspective view showing an exposure system to be used in the present invention.

In this embodiment, as shown in FIG. 6, the light-transmissible material 31 and the unhardened resin layer 96 are arranged so that they are separated from each other at a predetermined distance of "L1", and further an optical system 90 for conducting projection exposure on the unhardened resin layer 96 of photohardenable resin through the mask is provided. The optical system 90 comprises a reflector 91, a metal halide lamp (illuminator) 92, a lens 93 that spreads light from the metal halide lamp 92 to the whole area of the glass plate 31, a fresnel lens 94, the glass plate 31, a shutter 99, a projection lens 101, and an unhardened resin layer 96, which are arranged in this order. As described above, the unhardened resin layer 96 consists of a resin layer made of an photohardenable resin to be successively formed on the molding table 3. The fresnel lens 94 may be omitted.

The procedure of the optical stereolithography using the apparatus described above will be described.

At first, returning to FIG. 1, a toner mask is formed on the grass plate 31 in accordance with the stereolithographic data which are obtained with the aid of three-dimensional CAD by the controller (not shown). Then, the glass plate 31 is transferred to the exposure stage "F" while the unhardened resin layer is formed on the molding table 3.

Referring to FIG. 6, a metal halide lamp 92 is always turned on. Light from the metal halide lamp 92 enters the lens 93 and spreads by this lens 93 so as to cover the whole area of fresnel lens 94 and the glass plate 31. In this case, the fresnel lens 94 has its improved converging efficiency.

When the shutter 99 is opened, light from the metal halide lamp 92 is introduced into the projection lens (focusing means) 101, and brought into focus by the projection lens 101. Under the state that the light comes into a focus, the unhardened resin layer 96 is exposed to the light passing through any part except the mask. Then, the optical stereolithography is executed by repeating the above exposure operation.

In this embodiment, it is not required to provide a grid for collimating light unlike the conventional configuration. In addition, the amount of light reaching the unhardened resin layer 96 is not reduced, and thus the hardening time can be shortened.

Figure 7:
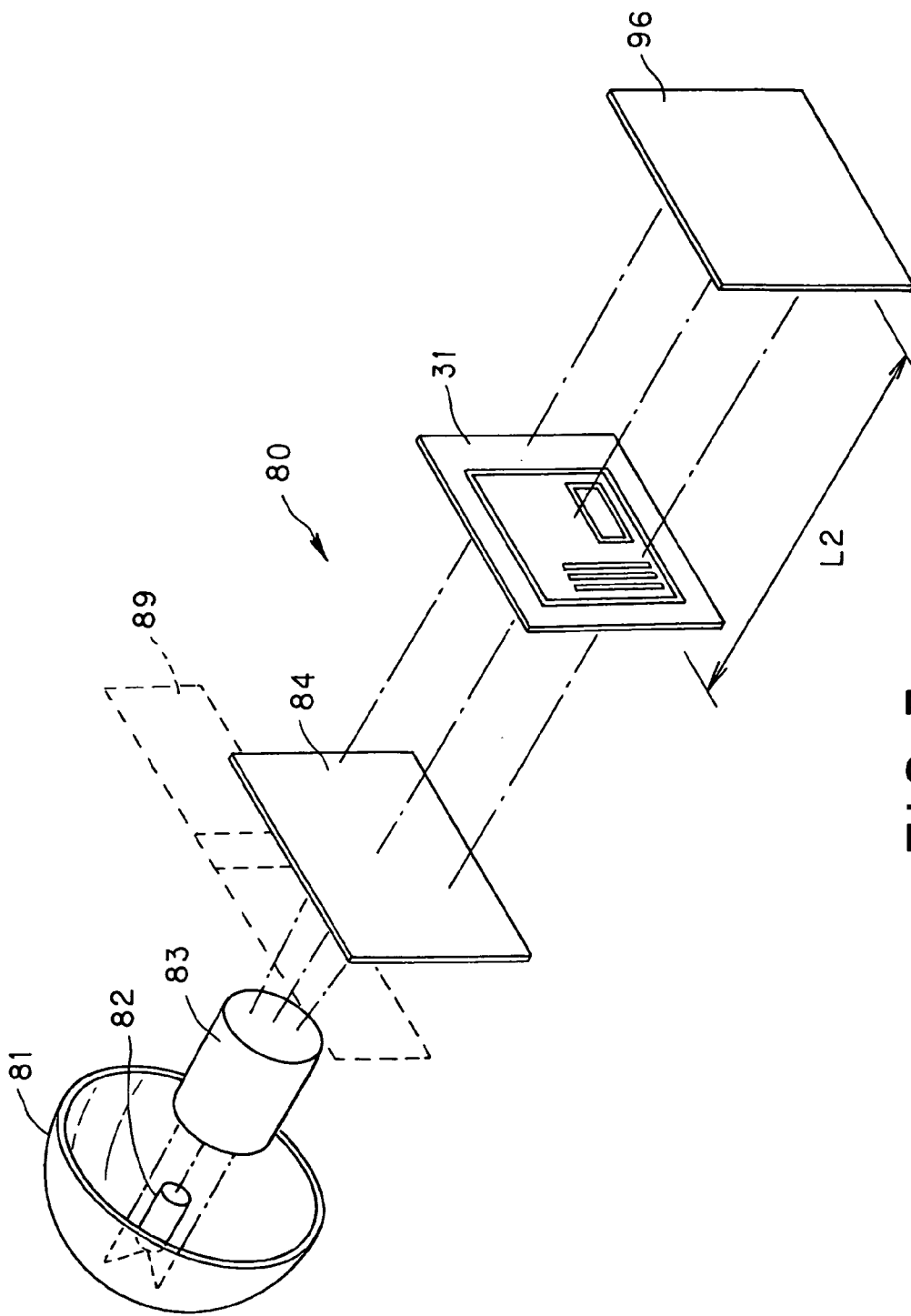
FIG. 7 is a perspective view showing another embodiment of the exposure system shown in FIG. 6.

FIG. 7 shows another embodiment of the optical system.

In this embodiment, the light-transmissible member 31 and the unhardened resin layer 96 are spaced from each other at a predetermined distance of "L2", and an optical system 80 for conducting projection exposure on the unhardened resin layer 96 of the photohardenable through the mask. The optical system 90 comprises a reflector 81, a metal halide lamp (illuminator) 82, a lens 83 that spreads light from the metal halide lamp 82 so as to cover the whole area of the glass plate 31, a fresnel lens 84, the glass plate 31, a shutter 89, and an unhardened resin layer 96, which are arranged in this order. As described above, the unhardened resin layer 96 consists of a resin layer made of an photohardenable resin to be successively formed on the molding table 3.

The metal halide lamp 82 is always turned on. When the shutter 89 is opened, light from the metal halide lamp 82 enters the lens 83. The lens 83 spreads the light so as to cover the whole area of the fresnel lens 84. The fresnel lens 84 forms collimated light. Thus, the unhardened resin layer 96 is exposed in the form of a plane to the collimated light from the fresnel lens 84 through the mask.

These lenses 83, 84 construct the collimated light forming member. However, the present invention is not limited to this configuration. It is also possible to provide other configurations, for example a combination of mirrors or the like to make the collimated light.

In this embodiment, it is not required to provide a grid for making collimated light unlike the conventional configuration. In addition, the amount of light reaching the unhardened resin layer 98 is not reduced, and thus the hardening time can be shortened.

Next, the data correction to be performed when the mask is prepared will be described below.

Figure 8:
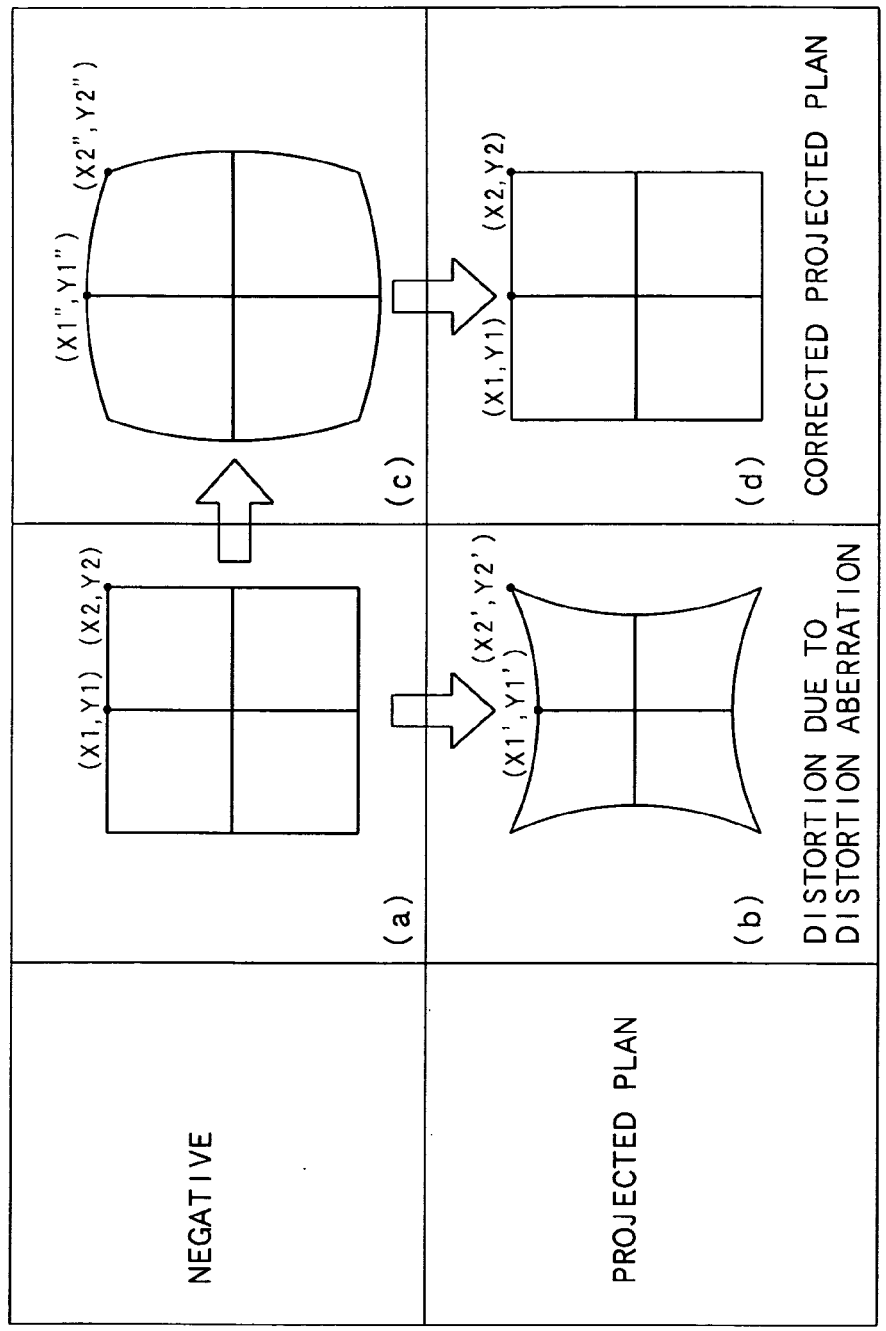
FIG. 8 is a schematic view showing data correction.

In the case of performing the projection exposure using the above optical system, distortion aberration, especially distortions in the shape of four sides occur (i.e., the four sides are inwardly curved) as shown in (b) of FIG. 8 when the stereolithographic data is directly used for the projection exposure without any modification for obtaining a regular quadrangle as shown in (a) of FIG. 8.

Therefore, if the data to be used in the process of preparing a mask are corrected in advance so that the four sides are curved outwardly. In this case, the original regular quadrangle can be finally obtained on the unhardened resin layer 96 as shown in (d) of FIG. 8 by performing the projection exposure based on the data after the correction.

Next, the data correction procedure will be described in detail with reference to the flowchart of FIG. 9.

At first, the profile shape data corresponding to the shape shown in (a) of FIG. 8 is obtained (S1). Then, the coordinates (X1, Y1), (X2, Y2) are determined on the basis of the data (S2). Correction values (X1', Y1'), (X2', Y2') of (b) of FIG. 8 which are stored in advance in a correction position data base are allocated to the coordinates (X1, Y1), (X2, Y2) (S3) to obtain the corrected shape data (X1", Y1"), (X2", Y2") (S4).

Subsequently, it is judged whether other data exist or not (S5). If it is judged that the data exist, the steps S1 to S4 are repeated insofar as other data exist. If it is judged that there is no other data, the portion surrounded by the profile is smeared (SG). The projection exposure is carried out on the basis of the corrected data thus obtained to obtain an original regular quadrangle shape on the unhardened resin layer 96.

Figure 10:
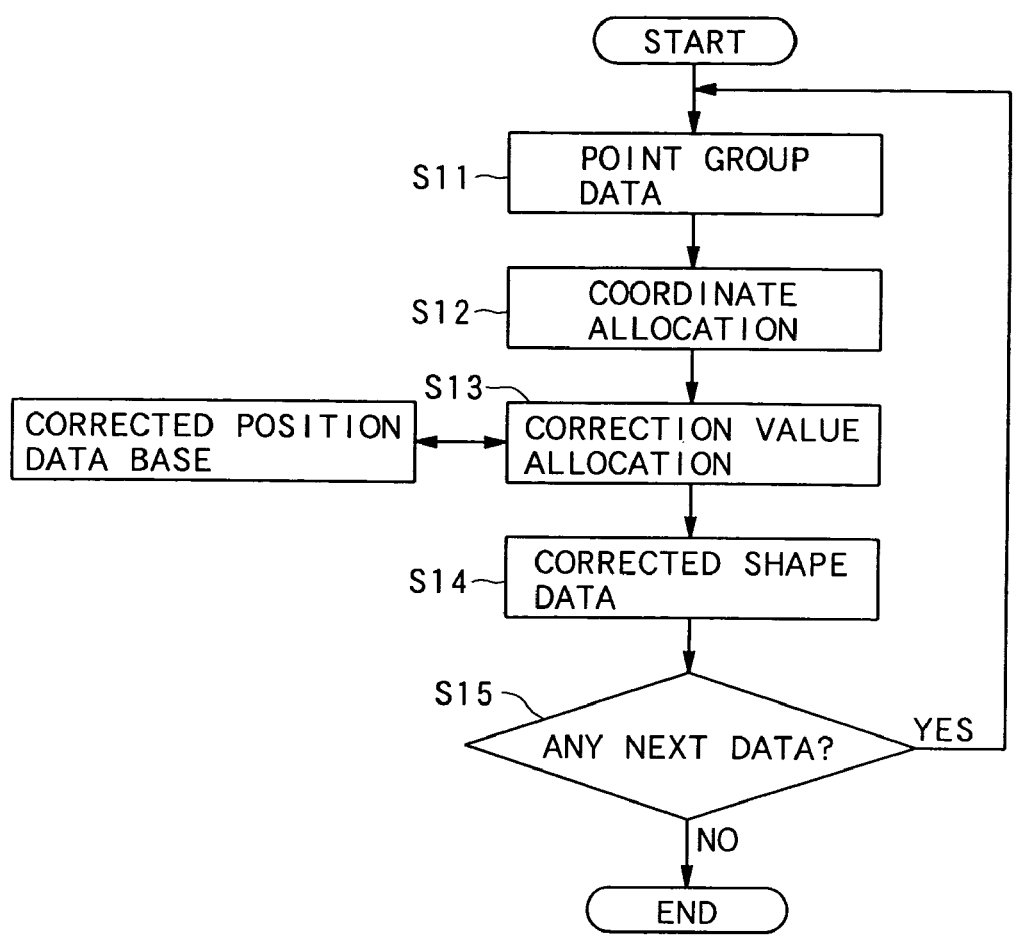
FIG. 10 is a flowchart showing another example of the data correction processing of the present invention.

FIG. 10 is a flowchart showing the procedure of another embodiment of the present invention.

Figure 9:
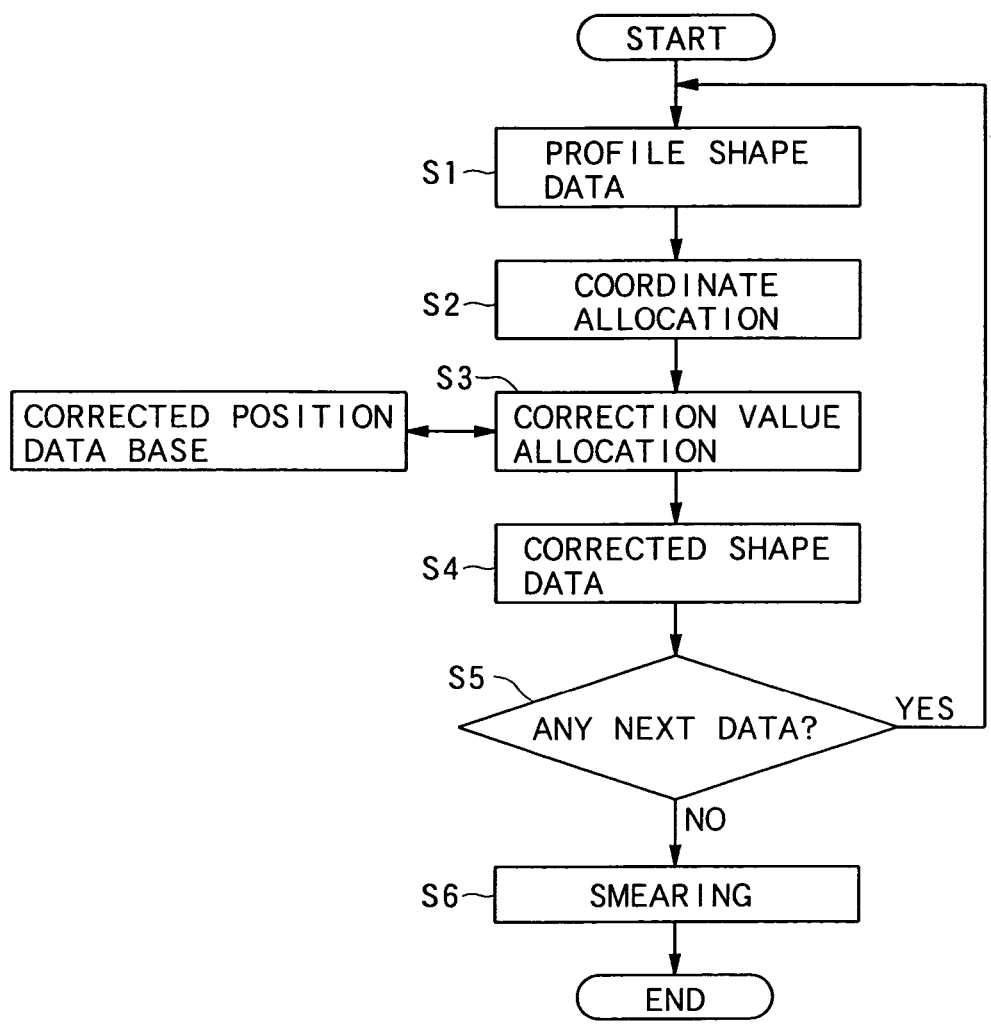
FIG. 9 is a flowchart showing an example of the data correction processing of the present invention.

Unlike the procedure shown in FIG. 9 in which the profile shape is determined and then the frame surrounded by the profile shape is smeared to obtain the data, the procedure of this embodiment is performed on the basis of bit map. That is, the shape data corresponding to that of (a) of FIG. 8 are obtained in terms of point group data (S11). Then, the coordinates (X1, Y1), (X2, Y2) are determined from the point group data (S12). Correction values (X1', Y1'), (X2', Y2') of (b) of FIG. 8 that are beforehand stored in a correction position data base are allocated to the coordinates (X1, Y1), (X2, Y2) (S13) to obtain the corrected shape data (X1", Y1"), (X2", Y2") (S14).

Subsequently, it is judged whether other data exist or not (S15). If it is judged that other data exist, the steps S11 to S14 are repeated until the other data are disappeared.

In this embodiment, although the processing time is increased as the steps of S11 to S14 are performed on the basis of the point group, just as in the case of the above embodiment, the original regular quadrangle can be obtained on the unhardened resin layer 96 as shown in (d) of FIG. 8 by performing the projection exposure based on the data after the correction.

Figure 11:
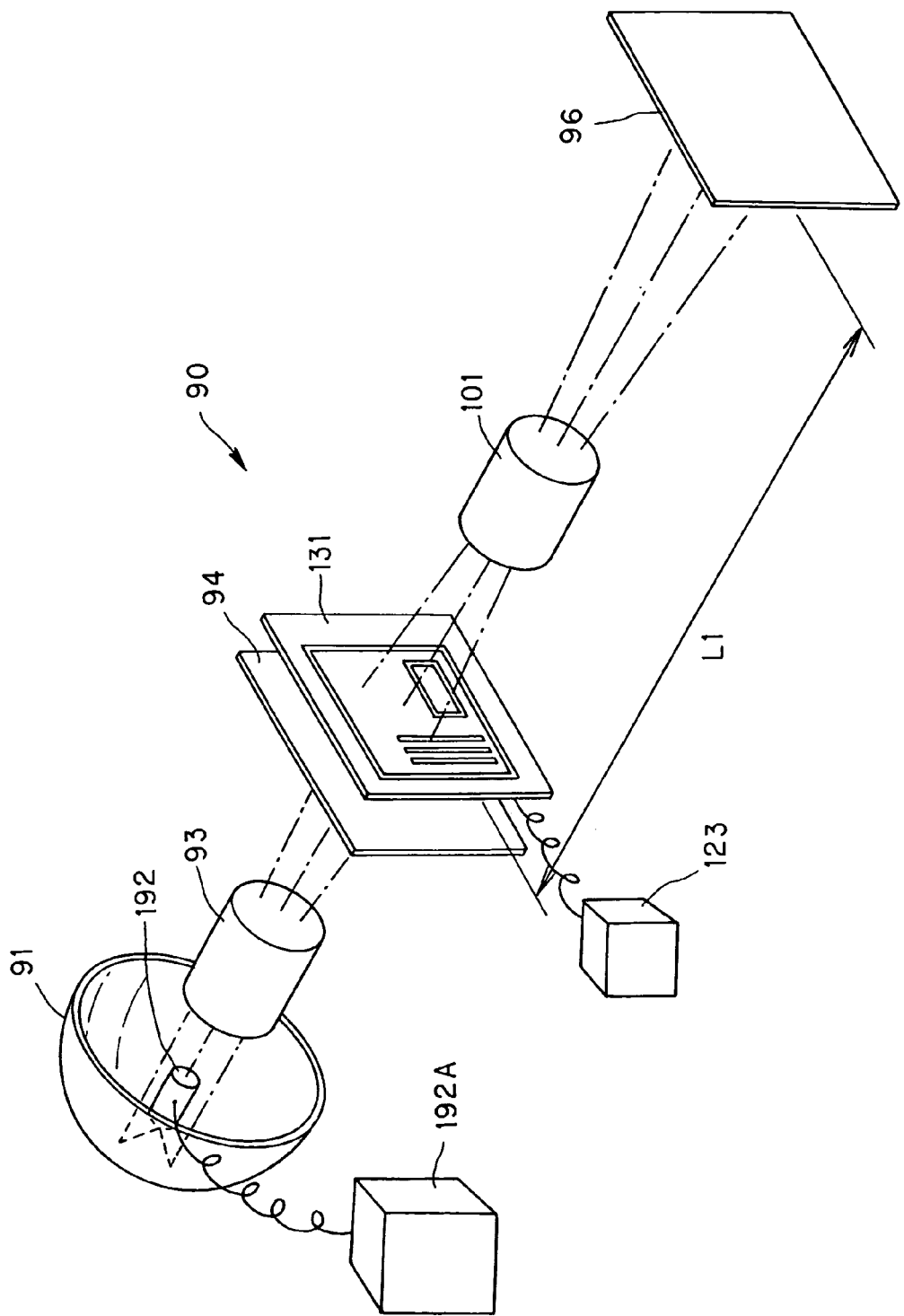
FIG. 11 is a perspective view showing another embodiment of the exposure system in which a liquid crystal element is used.

FIG. 11 illustrates another embodiment of the stereolithographic apparatus of the present invention.

The apparatus of this embodiment of the present invention is different from the apparatus shown in FIG. 6 in that an optical source 192 comprises a stroboscopic lamp, and the mask made of light-transmissible material consists of a liquid crystal mask 131. When the liquid crystal mask 131 is used, the mask 131 is fixed on the above exposure table "F" in contrast to that of FIG. 1.

In FIG. 11, the mask 131 and the unhardened resin layer 96 are arranged so as to be spaced from each other at a predetermined distance of "L1", and an optical system 90 for conducting projection exposure on the unhardened resin layer 96 of photohardenable resin through a mask is provided. The optical system 90 comprises a reflector 91, a stroboscopic light source (illuminator) 192, a lens 93 that spreads light from the stroboscopic light source 192 so as to cover the whole area of a liquid crystal mask 131, a fresnel lens 94, the mask 131, a projection lens 101, and an unhardened resin layer 96, which are arranged in this order.

In this embodiment, it is not required to provide a shutter unlike the apparatus of FIG. 6. In FIG. 11, reference numeral 192A denotes a charging/discharging device, and reference numeral 123 denotes a controller for controlling the liquid crystal mask 131. The unhardened resin layer 96 consists of a resin layer made of photohardenable resin to be successively formed on the molding table 3. The fresnel lens 94 may be omitted as in the case of the embodiment shown in FIG. 6.

In this embodiment, the stroboscopic light source 192 is used, so that there is no need to provide the shutter and the calorific value of the light source 192 can be reduced. Therefore, a relatively large cooling device is not required, and also the problem of the malfunction to be caused by the deformation of the shatter can be avoided. According to this embodiment, the calorific value of the optical source 192 is smaller than the conventional one, so that the thermal effect on the unhardened resin layer 96 can be resolved.

In spite of omitting a graphic representation, it is also possible to apply the above stroboscopic light source and the liquid crystal mask to the apparatus shown in FIG. 7.

In the present embodiment, as shown in FIG. 11, a controller 123 is connected to the liquid crystal mask 131 to control the liquid crystal mask 131. The controller 123 includes 3-D CAD, etc. to create and output the cross-sectional data corresponding to each layer obtained by horizontally slicing a three-dimensional model to be stereolithographically formed into thin layers, and a mask pattern is prepared on the basis of the output data from the controller by the liquid crystal mask.

When the controller 123 is actuated, a predetermined voltage signal corresponding to the stereolithographic data of one layer is applied to the liquid crystal device constituting the liquid crystal mask 131.

In FIG. 12, the liquid crystal device constituting the mask 131 has a plurality of electrodes (not shown) arranged so as to extend in the X and Y directions, and pixel portions for controlling the transmission/interception of light are formed at the intersections of the X and Y electrodes.

It is now assumed that the stereolithographic data of one layer (hereinafter referred to as "slice data" corresponds to the data representing a rectangle of "L1" in longitudinal length and "L2" in lateral length as shown in FIG. 12. The hardening of the resin according the slice data that represents the rectangle is performed on the basis of the slice data representing the rectangle concerned by carrying out the plane exposure while the plane exposure operation is shared into two sub plane exposure operations using two types of mask patterns shown in FIGS. 12A and 12B, respectively.

In FIG. 12, a notched portion 100 represents a light intercepting portion that intercepts light incident thereto, and an open portion 200 represents a light-transmissible portion. That is, when the controller 123 is actuated to control the voltage applied to a plurality of electrodes of the liquid crystal device, the light-transmissible portion 200 is formed at the center portion, and the light-intercepting portion 100 is also formed around the center portion as shown in FIG. 12A.

Under this condition, the stroboscopic light source 192 is turned on, so that the light is transmitted through the light-transmissible portion 200 to the photohardenable resin layer 96 at the center portion. As a result, the unhardened resin layer 96 at the light-transmissible portion 200 is hardened.

Subsequently, the controller 123 is actuated so that the light-intercepting portion 100 is formed at the center portion while the light-transmissible portion 200 is formed around the center portion a shown in FIG. 12B. Under this condition, the stroboscopic light source 192 is turned on, so that the light is transmitted to the photohardenable resin layer 96 through the light-transmissible portion 200. As a result, the unhardened resin layer 96 at the light-transmissible portion 200 can be hardened.

Here, if the light-transmissible portions 200 in FIGS. 12A and 12B are superimposed, it would be found that the superimposed portion corresponds to the exposure range based on the slice data that represents the rectangle with "L1" in longitudinal length and "L2" in lateral length.

In the above configuration, when the unhardened resin layer 96 is hardened on the basis of the slice data that represents the rectangle of "L1" in longitudinal length and "L2" in lateral length, the plane exposure is carried out in two steps by using two types of the mask patterns shown in FIGS. 12A and 12B (i.e., a first sub exposure step is carried out by using one mask pattern shown in FIG. 12A, and then a second sub exposure step is carried out by using the other mask pattern shown in FIG. 12B). Therefore, the distortion occurring due to the shrinkage on hardening of the photohardenable resin can be suppressed more remarkably in comparison with the conventional one in which the unhardened resin layer 96 on the basis of the slice data representing the rectangle of "L1" in longitudinal length and "L2" in lateral length is subjected to the plane exposure at a time.

Consequently, for example, the molding accuracy can be kept substantially in the same level as that of the conventional one in which the exposure is carried out by using a laser beam.

Various mask patterns may be used in place of the mask patterns shown in FIGS. 12A and 12B.

When the exposure range based on the slice data that represents a rectangle of "L1" in longitudinal length and "L2" in lateral length is set, as shown in FIGS. 13A and 13B, the mask patterns may be designed so that the light-intercepting portions 100 and the light-transmissible portions 200 are arranged in a checkered pattern. Furthermore, the mask patterns may be designed as strip patterns of the light-intercepting portions 100 and the light-permeable portions 200 shown in FIGS. 14A and 14B. In these cases, if the light-transmissible portions 200 in FIGS. 14A and 14B are superimposed, the superimposed portion is coincident with the exposure range based on the slice data that represents the rectangle of "L1" in longitudinal length and "L2" in lateral length.

Further, if mask patterns shown in FIGS. 15A to 15c are used, the plane exposure is carried out in three steps (i.e., the plane exposure operation is divided into three sub exposure operations). In this exposure process, the unhardened resin layer 96 is first exposed to light through a first light-transmissible portion 200 in the form of a cross as shown in FIG. 15A. Subsequently, it is secondly exposed to light through a second light-transmissible portion 200 (a part of the rectangle which excludes the cross used in the first exposure step and four corners of the rectangle as shown in FIG. 15B). Finally, it is exposed to light through a third light-transmissible portion 200 corresponding to the four corners.

If the mask patterns shown in FIG. 16A to FIG. 16D are used, the plane exposure is carried out in four steps i.e., the plane exposure operation is divided into four sub exposure steps). In FIG. 16A, the unhardened resin layer 96 is exposed to light through a light-transmissible portion 200 in the form of a quadrangle at the center of the rectangle. In FIGS. 16B to 16D, it is exposed to light through the light-transmissible portion 200 having a rectangular doughnut shape which is stepwise increased in size so as to exclude the previously exposed portion.

Further, if the mask patterns shown in FIGS. 17A to 17D are used, the plane exposure is carried out in four steps i.e., the plane exposure is divided into four sub exposure steps). In this case, the mask pattern is designed as if two wave-like light-transmissible portions are stepwise separated from each other in the opposite directions to the diagonal corners of the rectangle).

If the mask patterns shown in FIGS. 18A to 18H are used, the plane exposure is carried out in eight steps (i.e., the plane exposure is divided into eight exposure steps). In this case, the mask pattern is designed as if two wave-like light-transmissible portions are stepwise approached to each other from the opposite sides (diagonal corners). Furthermore, if the mask patterns as shown in FIGS. 19A to 19C are used, the plane exposure is carried out in three steps (i.e., the plane exposure is divided into three exposure steps).

In any configuration, if the light-transmissible portions 200 are superimposed, it is coincident with the exposure range based on the slice data representing the rectangle.

If the mask patterns shown in FIGS. 20A to 20D, the plane exposure is carried out in four steps. If the light-transmissible portions 200 in FIGS. 20A and 20B are superimposed, it is coincident with the exposure range based on the slice data that represents a rectangle. Further, if the light-transmissible portions 200 in FIGS. 20C and 20D are superimposed, it is coincident with the exposure range based on the slice data that represents a rectangle. Accordingly, this plane exposure provides the same effect as a case where the exposure range to be originally exposed to light is exposed to light twice. Therefore, the exposure time of a sub exposure step is set to a half of the original exposure time.

For example, if the exposure time when each mask pattern shown in FIGS. 12A to 19C is set to 3 to 5 seconds, the exposure time when each mask pattern shown in FIGS. 20A to 20D is set to 1.5 to 2.5 seconds.

In the above-described embodiments, when the unhardened resin layer 96 is hardened in accordance with the slice data that represents a rectangle of "L1" in longitudinal length and "L2" in lateral length, the plane exposure is carried out in plural steps in which the unhardened resin layer is partially or stepwise exposed to light in the form of a plane through each of plural mask patterns at plural times. Therefore, the distortion due to the shrinkage of hardening of photohardenable resin can be reduced more remarkably in comparison with that of the conventional one in which the plane exposure is carried out on the unhardened resin layer 96 on the basis of the slice data representing a rectangle of "L1" in longitudinal length and "L2" in lateral length at a time.

Therefore, the molding accuracy can be kept substantially in the same level as the plane exposure using a laser beam.

Figure 21:
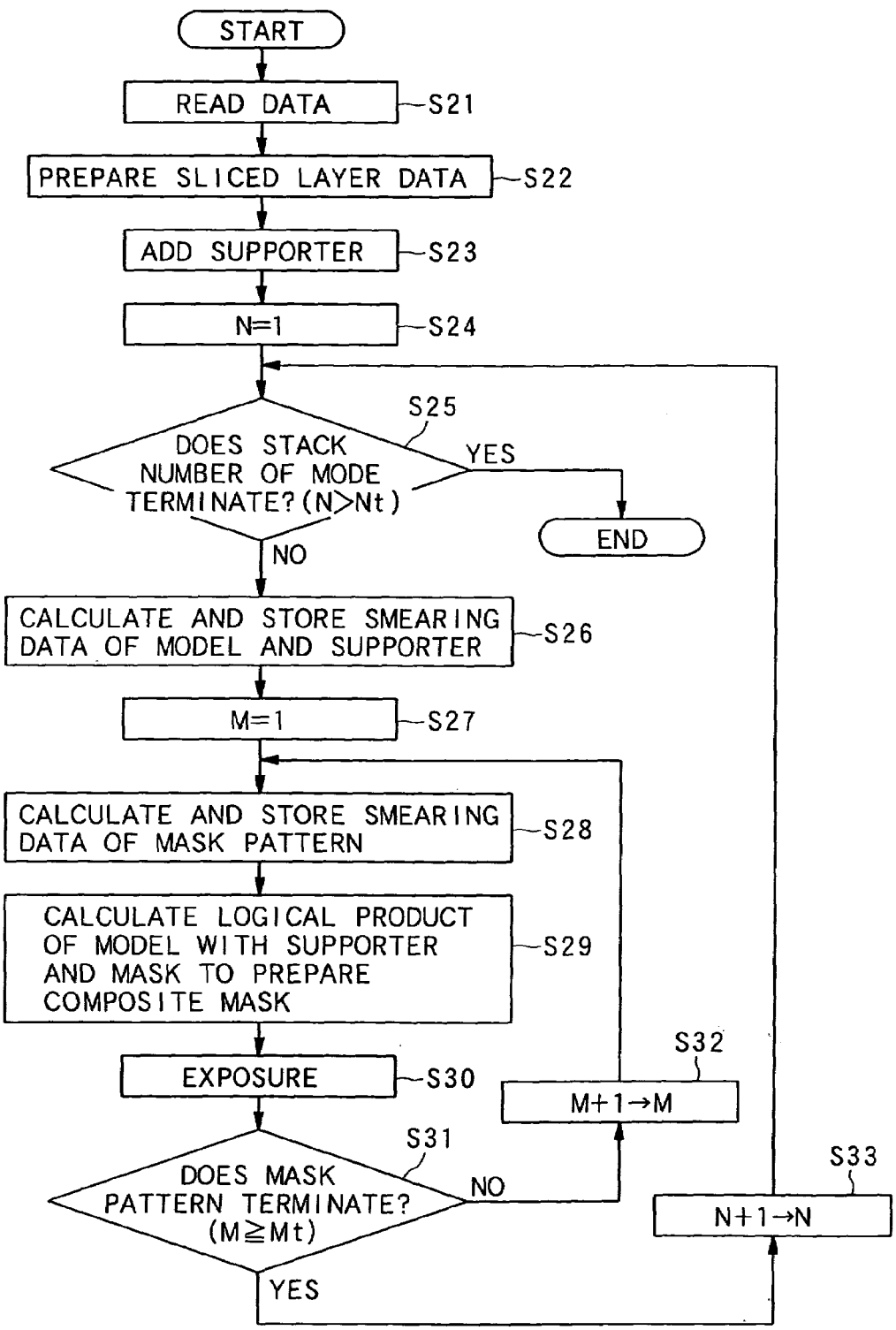
FIG. 21 is a flowchart showing the procedure of making the mask.

FIG. 21 is a flowchart for preparing composite mask patterns comprising both of stereolithographic slice data (including the data of a sliced three-dimensional object and the data of a supporter) and the data for a mask pattern as described above.

In FIG. 21, steps S1 to S3 are to create the slice data of respective layers on the basis of a three-dimensional object. The data for a three-dimensional object to be finally formed are read out from 3-D CAD or the like (S21). Then, the data thus read out is sliced into plural sliced data for the respective layers constituting the three-dimensional object (S22). Each data is added with data on a supporter (member for supporting a molding article during the molding process) (S23).

Subsequently, it is judged whether the lamination number (the layer stack number) Nt of the three-dimensional object (model) is completed (S25). That is, if the exposure operation on all the layers (the total number of the layers is equal to Nt) is completed, it is judged in step S25 that the lamination number Nt is terminated, and thus the process is finished. At the initial time when the plane exposure is started, the exposure operation is first carried out on the first layer (i.e., the lowermost layer). Here, when N represents the number of a layer to be subjected to the exposure operation, at the initial stage, N is set to "1" (S24) before the judgment of the step S24 is made (S25) as shown in FIG. 21.

If it is judged in S25 that N is not larger than Nt, the smearing data of the model and the supporter corresponding to the first layer (the slice data of the first layer) are calculated and stored (S26). Then, the first mask pattern for the first layer is selected. Here, when M represents the number of mask patterns used for each layer, M is set to "1" (S27). Thereafter, a smearing pattern of the first mask pattern (M=1) is calculated and stored when the first mask pattern (e.g., FIG. 12A) is used (S28). Subsequently, the logical product of the data (pattern) of the model and the supporter of the first layer (N=1) and the first mask pattern (M=1) is calculated to create a composite mask (S29), and then the exposure using the composite mask is carried out (S30).

Subsequently, it is judged in S31 whether the exposure using the mask patterns for the first layer is completed. Here, when Mt represents the total number of mask patterns used for each layer (for example, in the case of FIGS. 15A to 15C, Mt is equal to 3), it is judged in S31 whether M is not less than Mt (M≧Mt) If M is less than Mr, then the processing goes to step S32 to set M+1 to M, and then returns to S8 to calculate a smearing pattern when a second mask pattern (e.g., FIG. 12B) is used. Then, the processing of the steps S28 to S30 is carried to create the second composite mask and perform the plane exposure based on the second composite mask. Here, this loop is repeated until M is equal to Mt, and if it is judged in step S21 that M is not less than Mt, the processing goes to step S13 to set (N+1) to N (i.e., the second layer (N=2) is selected), and then returns to the step S25. Subsequently, the above loop process from the steps S5 to S13 is repeated until it is judged that N is more than Nt.

According to the present invention, the plane exposure can be carried out while it is divided into several sub exposure steps, and thus the unhardened resin layer is partially or stepwise subjected to the plane exposure. Therefore, the distortion caused by shrinkage on hardening of the photohardenable resin can be suppressed more remarkably as compared with the conventional one in which the plane exposure is performed at a time.

The present invention is not limited to the above embodiments, and various modifications may be made to the above embodiments.

For example, in the above embodiment, the liquid crystal mask is used. However, in place of the liquid crystal mask, a toner type mask as shown in FIGS. 6 and 7 may be used to have the same effect. Further, the liquid crystal mask and the unhardened resin layer are arranged so as to be spaced from each other. However, the liquid crystal mask and the unhardened resin layer may be arranged so that the liquid crystal mask is put on the unhardened resin layer. Further, in place of the stroboscopic light source, a normal light source such as a mercury lamp, a metal halide lamp, UV rays fluorescent lamp or the like may be used.

Further, the above embodiment illustrates the optical stereolithography in which a three-dimensional object is layered and stereolithographically molded in the upward or downward direction. If the three-dimensional object is larger than the usual, the optical stereolithography may be performed while the layers are laminated in the lateral (horizontal) direction without being stacked in the vertical direction. In this case, it goes without saying that the optical system may be also arranged in the lateral direction.

According to the present invention, the optical energy can be effectively, precisely, and cost effectively attained with respect to the resin's exposure surface. In addition, the calorific value of the light source can be prevented, and molding accuracy can be increased.

The present invention has been described in detail with respect to preferred embodiments, and it will now be obvious to those skilled in the art that changes and modifications may be made without departing from the invention in its broader aspects, and it is the intention, therefore, in the appended claims to cover all such changes and modifications as fall within in the true spirit of the invention.

What is claimed is:

1. An optical stereolithographic apparatus for performing optical stereolithography by preparing a mask for partially intercepting light on the basis of stereolithographic data for each photohardenable resin layer obtained by slicing a three dimensional object, exposing each unhardened resin layer of photohardenable resin to light through said mask, and repeating the exposure operation to stereolithographically form the three-dimensional object, characterized by including:

a controller for outputting stereolithographic data of each layer on the basis of the data of the three-dimensional object;

a mask forming unit for forming at least one mask having different mask patterns, wherein the exposure on each unhardened resin layer is divided into plural sub exposure steps so that the exposure is stepwise carried out by using each of said plural mask patterns one by one;

a resin layer forming unit for forming each said unhardened resin layer of photohardenable resin, said resin layer forming unit being arranged so as to be spaced from said mask forming unit at a predetermined distance;

a stroboscopic lamp configured to be an alternating source of light having an on-state and an off-state;

the alternating source of light is directed towards an already formed unhardened resin layer, wherein the on-state causes the unhardened resin layer to harden, and the alternating source of light is in the off-state while a next one of the each unhardened resin layer is formed on the hardened resin layer; and a focusing unit disposed between each said unhardened resin layer and said mask forming unit for focusing the light passing through the mask onto each said unhardened resin layer.

2. The optical stereolithographic apparatus as claimed in claim 1, wherein said mask forming unit is a toner mask forming unit for successively forming the plural mask patterns with toner electrostatically on the basis of the stereolithographic data of each layer.

3. The optical stereolithographic apparatus as claimed in claim 1, wherein said mask forming unit is a liquid crystal device for successively forming the plural mask patterns with liquid crystal on the basis of voltage signals corresponding to the stereolithographic data of each layer to be applied thereto.

4. The optical stereolithographic apparatus as claimed in claim 1, wherein the controller contains a distortion aberration correcting unit for correcting the stereolithographic data so as to prevent distortions in shape of the three-dimensional object.

5. A stereolithographic apparatus for stereolithographically forming a three-dimensional object by exposing a hardenable material layer to hardening-promoting medium in the form of a plane through a mask having a mask pattern for partially intercepting passage of the hardening promoting medium therethrough to thereby partially harden the hardenable material layer and repeating the exposure operation while a hardenable material layer is successively stacked on another hardenable material layer, whereby the three-dimensional object comprising the respective hardened material layers is formed, comprising:

a controller for generating and outputting stereolithographic data of each hardenable material layer on the basis of the data of the three-dimensional object;

a mask forming unit for forming at least one mask having different mask patterns, wherein the exposure operation on each unhardened material layer is divided into plural sub exposure steps so that the exposure is stepwise carried out by individually using each of said plural mask patterns one by one;

a resin layer forming unit for forming an unhardened resin layer of photohardenable resin, so that said unhardened resin layer of photohardenable resin is spaced from said mask forming unit at a predetermined distance;

an illuminator for emitting light toward the unhardened resin layer;

a shutter configured to allow the light to pass therethrough to the unhardened resin layer, wherein the unhardened resin layer is hardened by the light;

the shutter further configured to intercept the light while a next unhardened resin layer is stacked on the hardened resin layer; and a focusing unit disposed between said resin layer forming unit and said mask forming unit for focusing the light passing through the mask onto the unhardened resin layer.

6. The stereolithographic apparatus as claimed in claim 5, wherein said mask forming unit is a toner mask forming unit for successively forming each of the plural mask patterns on said at least one mask with toner electrostatically on the basis of the stereolithographic data of each hardenable material layer.

7. The stereolithographic apparatus as claimed in claim 5, wherein said mask forming unit is a liquid crystal device for successively forming each of the plural mask patterns on said at least one mask by controlling a voltage to be applied to liquid crystal on the basis of the stereolithographic data of each hardenable material layer.

8. The stereolithographic apparatus as claimed in claim 5, wherein the hardening-promoting medium is selected from light, UV rays, heat, pressure, electromagnetic waves, and chemical components, and the material of the hardenable material layer is composed of any material which is hardened by applying the hardening-promoting medium to the material.

9. The stereolithographic apparatus as claimed in claim 5, wherein the controller contains a distortion aberration correcting unit for correcting the stereolithographic data so as to prevent distortions in shape of the three-dimensional object.

10. An optical stereolithographic apparatus for performing optical stereolithography by preparing a mask for partially intercepting light on the basis of stereolithographic data for each photohardenable resin layer obtained by slicing a three dimensional object, exposing each unhardened resin layer of photohardenable resin to light through the mask, and repeating the exposure operation to stereolithographically form the three-dimensional object, characterized by including an optical system for exposing the unhardened resin layer to light passing through said mask in the form of a plane while the unhardened resin layer and said mask are arranged so as to be spaced from each other at a predetermined distance;

said optical system comprising:

an illuminator for emitting light toward the unhardened resin layer;

a shutter configured to allow the light to pass therethrough to the unhardened resin layer, wherein the unhardened resin layer is hardened by the light;

the shutter further configured to intercept the light while a next unhardened resin layer is stacked on the hardened resin layer;

a lens for spreading the light emitted from said illuminator so that the light passing therethrough covers the overall area of said mask;

a projection lens and said mask arranged so that said projection lens faces the unhardened resin layer; and the unhardened resin layer of the photohardenable resin being exposed to light passing through said optical system.

11. The optical stereo lithographic apparatus as claimed in claim 10, wherein said optical system includes an illuminator for emitting light toward the unhardened resin layer, a lens for spreading the light emitted from said illuminator so that the light passing therethrough covers the overall area of said mask, and said mask through which the light from said illuminator is partially passed, are arranged so that said unhardened resin layer of the photohardenable resin is exposed to light passing through said optical system.

12. The optical stereolithographic apparatus as claimed in claim 10, further including a controller for outputting stereolithographic data of each layer on the basis of the data of the three-dimensional object; a mask forming unit for forming a mask in accordance with the stereolithographic data of each layer; and a resin layer forming unit for forming each unhardened resin layer of photohardenable resin, said resin layer forming unit being arranged so as to be spaced from said mask forming unit at a predetermined distance.

13. The optical stereolithographic apparatus as claimed in claim 10, wherein the shutter, the lens, the projection lens and the photohardenable resin layer are arranged along a line.

14. The stereolithographic apparatus as claimed in claim 10, wherein said light source is selected from any one of a stroboscopic lamp, mercury lamp, a metal halide lamp, and a UV fluorescent lamp.

15. An optical stereolithographic apparatus for preparing a mask on a light-transmissible member, illuminating light to an unhardened resin layer of photohardenable resin through the mask to harden the photohardenable resin of the unhardened resin layer, and repeating the mask preparation and the light exposure to stereolithographically form a three-dimensional object, comprising
a controller for outputting stereolithographic data;
a shutter configured to allow the light to pass therethrough to an unhardened resin layer, wherein the unhardened resin layer is hardened by the light;
the shutter further configured to intercept the light while a next unhardened resin layer is stacked on the hardened resin layer;
a mask forming unit for forming a mask on the light-transmissible member on the basis of the stereolithographic data of one layer contained in the stereolithographic data output from said controller;
a resin layer forming unit for forming an unhardened resin layer of photohardenable resin, so that said unhardened resin layer is spaced from said mask forming unit at a predetermined distance;
an illuminator for emitting light toward the unhardened resin layer; and
a focusing unit disposed between said unhardened resin layer and said mask forming unit for focusing the light passing through the mask onto the unhardened resin layer.

16. The optical stereolithographic apparatus as claimed in claim 15, wherein said mask forming unit is a toner mask forming unit for electrostatically forming a mask with toner.

17. The optical stereolithographic apparatus as claimed in claim 15, wherein said mask forming unit is a liquid crystal device for forming a mask with liquid crystal on the basis of voltage signals corresponding to stereolithographic data of each layer to be applied thereto.

18. The optical stereolithographic apparatus as claimed in claim 15, wherein said mask fonning unit forms at least one mask having different mask patterns, and the exposure on each unhardened resin layer is divided into plural sub exposure steps so that the exposure is stepwise carried out by using each of said plural mask patterns one by one.

19. The optical stereolithographic apparatus as claimed in claim 18, wherein said optical system includes an illuminator for emitting light toward the unhardened resin layer, a lens for spreading the light emitted from said illuminator so that the light passing therethrough covers the overall area of each of said masks, each of said masks through which the light from said illuminator is partially passed, and a projection lens, which are arranged between the mask forming unit and the unhardened resin layer so that said projection lens faces the unhardened resin layer, the unhardened resin layer of the photohardenable resin being exposed to light passing through said optical system.

20. The optical stereo lithographic apparatus as claimed in claim 18, wherein said optical system includes an illuminator for emitting light toward the unhardened resin layer, a lens for spreading the light emitted from said illuminator so that the light passing therethrough covers the overall area of each of said masks, and each of said masks through which the light from said illuminator is partially passed, which are arranged such that the unhardened resin layer of the photohardenable resin is exposed to light passing through said optical system.

21. The optical stereolithographic apparatus as claimed in claim 18, wherein said mask forming unit is a toner mask forming unit for successively forming the plural mask patterns with toner electrostatically on the basis of the stereolithographic data of each layer.

22. The optical stereolithographic apparatus as claimed in claim 18, wherein said mask forming unit is a liquid crystal device for successively forming the plural mask patterns with liquid crystal on the basis of voltage signals corresponding to the stereolithographic data of each layer to be applied thereto.

23. The optical stereolithographic apparatus as claimed in claim 15, wherein the controller contains a distortion aberration correcting unit for correcting the stereolithographic data so as to prevent distortions in shape of the three-dimensional object.

24. The optical stereo lithographic apparatus as claimed in claim 15, wherein the shutter, the mask forming unit, the lens system, the focusing unit and the photohardenable resin layer are arranged along a line.

25. An optical stereolithographic apparatus for performing optical stereolithography by preparing a mask for partially intercepting light on the basis of stereolithographic data for each photohardenable resin layer obtained by slicing a three dimensional object, exposing each unhardened resin layer of photohardenable resin to light through the mask, and repeating the exposure operation to stereolithographically form the three-dimensional object, characterized by including an optical system for exposing the unhardened resin layer to light passing through said mask in the form of a plane while the unhardened resin layer and said mask are arranged so as to be spaced from each other at a predetermined distance;
said optical system comprising:
an illuminator for emitting light toward the unhardened resin layer;
a shutter configured to allow the light to pass therethrough to an unhardened resin layer, wherein the unhardened resin layer is hardened by the light;
the shutter further configured to intercept the light while a next unhardened resin layer is stacked on the hardened resin layer;
a lens system for collimating and spreading the light emitted from said illuminator so that the light passing therethrough covers the overall area of said mask;
a projection lens and said mask arranged so that said projection lens faces the unhardened resin layer; and
the unhardened resin layer of the photohardenable resin being exposed to light passing through said optical system.

26. The optical stereolithographic apparatus as claimed in claim 25, wherein the shutter, the lens, the projection lens and the photohardenable resin layer are arranged along a line.

27. An optical stereolithographic apparatus for preparing a mask at light-transmissible member, illuminating light to an unhardened resin layer of photohardenable resin through the mask to harden the photohardenable resin of the unhardened resin layer, and repeating the mask preparation and the light exposure to stereolithographically form a three-dimensional object, comprising a controller for outputting stereolithographic data;

a shutter configured to allow the light to pass therethrough to an unhardened resin layer, wherein the unhardened resin layer is hardened by the light;

the shutter further configured to intercept the light while a next unhardened resin layer is stacked on the hardened resin layer;

a mask forming unit for forming a mask at the light-transmissible member on the basis of the stereolithographic data of one layer contained in the stereolithographic data output from said controller;

a resin layer forming unit for forming an unhardened resin layer of photohardenable resin, said resin layer forming unit being arranged so as to be spaced from said mask forming unit at a predetermined distance;

an illuminator for emitting light toward the unhardened resin layer;

a lens system for collimating light from said illuminator; and a focusing unit disposed between the unhardened resin layer and said mask forming unit for focusing the light passing through the mask onto the unhardened resin layer.

28. The optical stereolithographic apparatus as claimed in claim 27, wherein the controller contains a distortion aberration correcting unit for correcting the stereolithographic data so as to prevent distortions in shape of the three-dimensional object.

29. An optical stereolithographic apparatus for performing optical stereolithography by preparing a mask for partially intercepting light on the basis of stereolithographic data for each photohardenable resin layer obtained by slicing a three dimensional object, exposing each unhardened resin layer of photohardenable resin to light through the mask, and repeating the exposure operation to stereolithographically form the three-dimensional object, characterized by including an optical system for exposing the unhardened resin layer to light passing through said mask in the form of a plane while the unhardened resin layer and said mask are arranged so as to be spaced from each other at a predetermined distance;

said optical system comprising:

an illuminator for emitting light toward the unhardened resin layer;

a shutter configured to allow the light to pass therethrough to the unhardened resin layer, wherein the unhardened resin layer is hardened by the light;

the shutter further configured to intercept the light while a next unhardened resin layer is stacked on the hardened resin layer;

a lens for spreading the light emitted from said illuminator so that the light passing therethrough covers the overall area of said mask;

a projection lens and said mask arranged so that said projection lens faces the unhardened resin layer; and the unhardened resin layer of the photohardenable resin being exposed to light passing through said optical system, wherein the optical stereolithographic apparatus is configured so as to control the preparation of the mask, the exposure of the unhardened resin layer to light and the operation of the shutter successively and repetitively in connection with the successive and repetitive formation of the hardenable resin layer and the hardened resin layer.

30. The optical stereolithographic apparatus as claimed in claim 27, wherein the shutter, the mask forming unit, the lens system, the focusing unit and the photohardenable resin layer are arranged along a line.

* * * * *